United States Patent [19]
Yamauchi et al.

[11] Patent Number: 6,061,808
[45] Date of Patent: May 9, 2000

[54] SEMICONDUCTOR MEMORY DEVICE HAVING A MULTIBIT TEST MODE

[75] Inventors: Tadaaki Yamauchi; Mikio Asakura; Takashi Ito, all of Hyogo, Japan

[73] Assignee: Mitsubishi Denki Kabushiki Kaisha, Tokyo, Japan

[21] Appl. No.: 09/332,364

[22] Filed: Jun. 14, 1999

Related U.S. Application Data

[63] Continuation of application No. 08/781,387, Jan. 13, 1997.

[30] Foreign Application Priority Data

May 30, 1996 [JP] Japan .................................. 8-136935

[51] Int. Cl.⁷ ............................ G01R 31/28; G06F 11/00
[52] U.S. Cl. ............................................. 714/6; 365/201
[58] Field of Search .................................. 714/6, 2, 3, 5, 714/8, 25, 42, 48, 30, 718, 733; 365/201, 200, 230.03, 189.05

[56] References Cited

U.S. PATENT DOCUMENTS

| | | | |
|---|---|---|---|
| 5,091,884 | 2/1992 | Kagami | 365/200 |
| 5,293,386 | 3/1994 | Muhmenthaler et al. | 371/21.1 |
| 5,416,741 | 5/1995 | Ohsawa | 365/201 |
| 5,488,578 | 1/1996 | Yamada | 365/49 |
| 5,535,161 | 7/1996 | Kato | 365/200 |
| 5,537,351 | 7/1996 | Suwa et al. | 365/189.02 |
| 5,544,106 | 8/1996 | Koike | 365/200 |
| 5,548,596 | 8/1996 | Tobita | 371/21.2 |
| 5,555,212 | 9/1996 | Toshiaki et al. | 365/200 |
| 5,574,729 | 11/1996 | Kinoshita et al. | 371/10.3 |
| 5,654,924 | 8/1997 | Suzuki et al. | 365/189.05 |

FOREIGN PATENT DOCUMENTS

| | | |
|---|---|---|
| 63-140499 | 6/1988 | Japan . |
| 2-3199 | 1/1990 | Japan . |

*Primary Examiner*—Robert W. Beausoliel, Jr.
*Assistant Examiner*—Nadeem Iqbal
*Attorney, Agent, or Firm*—McDermott, Will & Emery

[57] ABSTRACT

In a predetermined multibit test mode, a multibit test circuit 114 issues determination result data pairs RDM0 and /RDM0 to RDM3 and /RDM3, each of which corresponds to match/mismatch of logics of data read from memory cells selected by one column select line in corresponding one of memory cell plane blocks. In each memory cell plane block, memory cell columns selected by one single column select line can be replaced as a unit. The unit of memory cell columns containing a defective memory cell is replaced in accordance with determination result data RDM0 and /RDM0 to RDM3 and /RDM3.

7 Claims, 16 Drawing Sheets

CSL:4-BIT LINE PAIR SELECT

SEMICONDUCTOR MEMORY DEVICE HAVING A MULTIBIT TEST MODE

This application is a continuation of application Ser. No. 08/781,387 filed Jan. 13, 1997.

BACKGROUND OF THE INVENTION

1. Field of the Invention

The present invention relates to a semiconductor memory device, and in particular to a circuit structure for controlling a test operation of a dynamic semiconductor memory device.

2. Description of the Background Art

FIG. 17 schematically shows a whole structure of a dynamic semiconductor memory device in the prior art. In FIG. 17, a semiconductor memory device 1 includes four memory cell planes 2a–2d, which are formed on a semiconductor chip and each has a plurality of memory cells arranged in a matrix form.

In order to select a memory cell in accordance with an address signal, there are arranged a row select circuit (a row predecoder, a row decoder and a word line driver) and a column select circuit (a column predecoder, a column decoder and an I/O gate), which are not shown for simplifying the figure.

Each of memory cell planes 2a–2d is divided into four lumn groups. A global I/O line pair GIOP is arranged for each column group. When one of memory cell planes 2a–2d is selected, the memory cell of one bit is selected in each of the column groups in the selected memory cell plane, and is coupled to global I/O line pair GIOP for the selected memory cell.

The semiconductor memory device further includes preamplifier/write-buffers 7, which are provided correspondingly to global I/O line pairs GIOP for input/output of data to and from corresponding global I/O line pairs GIOP, respectively, read drivers 8, which amplify internal read data sent from the corresponding preamplifiers and send the same to the corresponding read data buses RDAP (RDAPa–RDAPd), respectively, first test mode circuits 9, which are provided correspondingly to memory cell planes 2a–2d, respectively, and determine match/mismatch of logics of data read from preamplifier/write-buffers 7 in a test operation mode, a second test mode circuit 10, which receives signals indicative of results of determination sent from first test mode circuits 9 provided for memory cell planes 2a–2d, respectively, and determines match/mismatch of logics of the determination result signals thus received, and a driver circuit 11 which receives signals on read data buses RDAPa–RDAPd and a signal sent from test mode circuit 10, and selectively transmits the received signals to an output buffer 13 via an output bus RDP.

Preamplifier/write-buffers 7 select one of the four column groups in each of memory cell planes 2a–2d, and the memory cell data in the selected column group is transmitted via read driver 8 onto the corresponding one of read data buses RDAPa–RDAPd.

In the test operation mode, all the four column groups are selected in each of memory cell planes 2a–2d, and the output signals of four preamplifiers 7 are transmitted to corresponding first test mode circuit 9.

In the normal operation mode, driver circuit 11 selects data read from the selected memory cell plane among data read onto read data buses RDAPa–RDAPd, and send the same to output buffer 13.

In the test operation mode, driver circuit 11 selects the signal indicative of the test result sent from test mode circuit 10, and transmits the same via output data bus RDP to output buffer 13.

Write buffers of preamplifier/write-buffers 7 are coupled to an input buffer 12 via an input data bus WD. Write buffers 7 corresponding to the selected one among memory cell planes 2a–2d are activated, and data is written via the write buffer into selected memory cells contained in the selected column group in the selected memory cell plane.

The semiconductor memory device further includes an address buffer 3 which receives an externally applied address signal and produces an internal address signal, an ATD generating circuit 4 which detects change in the internal address signal (internal column address signal) sent from address buffer 3 and generates an address change detection signal ATD, a PAE generating circuit 5 which is responsive to address change detection signal ATD sent from ATD generating circuit 4 to generate a preamplifier enable signal PAE for activating the preamplifier of preamplifier/write-buffer 7, and an IOEQ generating circuit 6 which is responsive to address change detection signal ATD sent from ATD generating circuit 4 and generates an equalize instruction signal IOEQ for equalizing global I/O line p air GIOP.

Global I/O line pair GIOP is formed of a pair of complementary signal lines for transmitting data signals which are complementary to each other. Equalize signal IOEQ functions to equalize the potentials on global I/O lines of global I/O line pair GIOP.

The semiconductor memory device further includes an internal voltage regulator 29, which receives an externally applied power supply potential Vcc, and generates a power supply potential Vccp for a peripheral circuit and a power supply potential Vccs for the memory cell plane, which are lower than external power supply potential Vcc. Power supply potential Vccp for peripheral circuit is supplied as an operation power supply potential to preamplifier/write-buffers 7, read drivers 8 and others.

Power supply potential Vccs for memory cell plane is applied to circuits for driving memory cell planes 2a–2d (i.e., sense amplifiers for charging/discharging bit lines) and substrate regions of p-channel MOS transistors in the planes.

Output buffer 13 and input buffer 12 perform external input/output of data via a common data input terminal DQ.

A multibit test operation related to the invention will be described below.

As a storage capacity of the semiconductor memory device increases, the number of memory cells increases. If determination of defect/nondefect in memory cells is performed bit by bit, an extremely long test time is required, resulting in increase in cost of chips. Therefore, determination of defect/nondefect is performed on multiple memory cells at a time, so that the test time can be reduced. This manner of performing the test on multiple memory cells at a time is called a multibit test mode.

An operation of writing test data in the multibit test mode will be described below. In each of memory cell planes 2a–2d, one memory cell row is selected. Then, in each of memory cell planes 2a–2d, memory cells of 4 bits are selected from memory cells belonging to the selected memory cell row. Test data to be written into the selected memory cells is transmitted to the write buffers in preamplifier/write-buffers 7 from input buffer 12.

In the multibit test mode, all the write buffers are enabled. Thereby, the same test data is written into the selected memory cells of 4 bits in each of memory cell planes 2a–2d, and thus the same test data is written into the memory cells of 16 bits in total.

Then, data reading in the multibit test mode will be described below.

Similarly to the test data writing, memory cells of 4 bits are simultaneously selected in each of memory cell planes 2a–2d. All the preamplifiers included in preamplifier/write-buffers 7 are enabled. Data of 4-bit memory cells selected in each of memory cell planes 2a–2d is amplified by the preamplifiers, and is transmitted to corresponding first test mode circuits 9.

Each first test mode circuit 9 determines match/mismatch of logics of received memory cell data of 4 bits, and sends a signal indicative of the result of determination to second test mode circuit 10.

Second test mode circuit 10 operates in accordance with the determination results sent from four first test mode circuits 9, and determines whether match of logics of test data read from four first test mode circuits 9 is detected or not.

The determination data issued from test mode circuit 10 is applied to output buffer 13 via driver 11, and output buffer 13 transmits this determination data to data I/O terminal DQ.

Thus, second test mode circuit 10 determines match/mismatch of logics of all the data of memory cell groups each including the memory cells of 4 bits selected in each of memory cell planes 2a–2d, i.e., all the data of memory cells of 16 bits in total. Based on the determination data sent from second test mode circuit 10, it is determined whether a defective memory cell is present among the simultaneously selected memory cells of 16 bits.

As described above, memory cells of 16 bits can be tested at a time, the test time can be significantly reduced.

In the conventional structure of the semiconductor memory device, the first test mode circuits are provided for the plurality of memory cell planes, respectively, and the output signals of these first test mode circuits are transmitted to the second test mode circuit, so that the second test mode circuit determines defect/nondefect of simultaneously selected memory cells.

In the above structures of the test mode circuits, however, it is impossible to specify the defective memory cell among the selected memory cells.

For example, in semiconductor memory devices having increased storage capacities, when a defective memory cell was found by the test, a memory cell column containing the defective memory cell is replaced with a backup or spare memory cell column. This replacement can prevent a malfunction, even when the defective memory cell was found.

In the multibit test of the semiconductor memory device in the prior art, however, the replacement with the spare memory cell column is impossible, because it is difficult to specify the memory cell column containing the defective memory cell. When an operation test was performed in the multibit test mode for reducing a test time, such a problem arises that a malfunction by the defective memory cell cannot be overcome.

SUMMARY OF THE INVENTION

An object of the invention is to provide a semiconductor memory device in which a memory cell column containing a defective memory cell can be specified in a multibit test mode.

Another object of the invention is to provide a semiconductor memory device, which allows a multibit test for reducing a test time, and also allow replacement of a memory cell column containing a defective memory cell with a spare memory cell column for overcoming a malfunction.

In summary, the invention provides a semiconductor memory device including a control circuit, a first number of memory cell blocks more than one, and a test circuit.

The control circuit controls a test mode operation of the semiconductor memory device in accordance with an externally applied control signal. Each of the memory cell blocks includes a plurality of memory cells arranged in a matrix form, a column select circuit for simultaneously selecting a second number of memory cell columns more than one, and a read circuit for reading the second number of storage data from the memory cells belonging to the selected memory cell columns. The test circuit receives the second number of storage data from each of the memory cell blocks, and is controlled by the control circuit to issue either a first determination signal corresponding to a result of comparison of the storage data sent from all the memory cell blocks or the first number of second determination signals each corresponding to a result of comparison performed on the second number of storage data.

Preferably, each of the memory cell blocks includes a plurality of spare memory cell columns forming a unit(s) each including the second number of memory cell columns, and a spare column select circuit for storing an externally set address value and, when an external address signal corresponds to the set address value, selecting the corresponding unit of the spare memory cell columns.

According to another aspect of the invention, a semiconductor memory device includes a control circuit, a first number of first memory cell blocks more than one, and a test circuit.

The control circuit controls a test mode operation of the semiconductor memory device in accordance with an externally applied control signal. Each of the memory cell blocks includes a plurality of memory cells arranged in a matrix form, a column select circuit for handling memory cell columns of n (n: natural number) in number as a unit and, in accordance with an externally applied address signal, simultaneously selecting the memory cell column units of m (m: natural number) in number depending on a test mode signal sent from the control circuit, a read circuit for reading storage data of (n×m) in number from the memory cells belonging to the selected memory cell columns, and data match detecting circuits of n in number. The ith ($1 \leq i \leq n$) data match detecting circuit receives the storage data of m in number from the ith memory cell column in each of the memory cell column units, and issues a match detection signal depending on match/mismatch of the received storage data. The test circuit receives the match detection signals of n in number from each of the memory cell blocks, and is controlled by the control circuit to issue either a first determination signal corresponding to a result of comparison of the match detection signals sent from all the memory cell blocks or the first number of second determination signals each corresponding to a result of comparison performed on the match detection signals of n in number.

Preferably, each of the memory cell blocks further includes spare memory cell columns including a plurality of memory cell column groups each formed of the memory cell column units of n in number, and a spare column select circuit for storing an externally set address value and, when an externally applied address signal corresponds to the set address value, selecting the corresponding group of the spare memory cell columns.

Accordingly, a major advantage of the invention is as follows. For data which are read from the simultaneously selected memory cell column in each of the memory, match/mismatch of logics can be detected independently from other data, so that it is possible to specify the memory cell column having a defective memory cell in a multibit test.

Another advantage of the invention is as follows. In each memory cell block, the memory cells to be selected simultaneously forms the unit, and this memory cell column unit can be replaced with the spare memory cell column unit, so that the memory cell column having a defective memory cell can be repaired in accordance with results of the multibit test.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
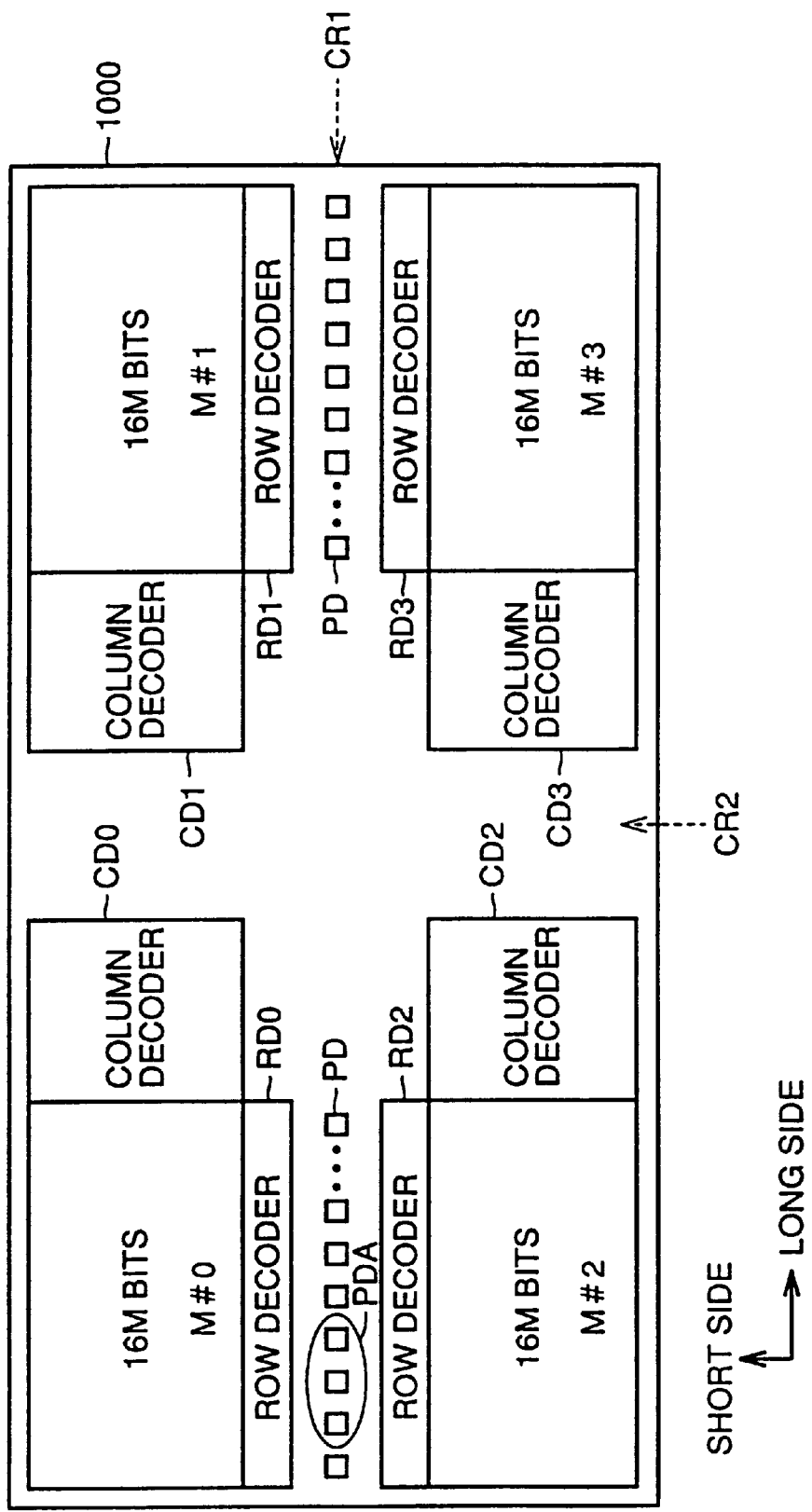
FIG. 1 shows a whole layout of a semiconductor memory device 1000 of an embodiment 1 of the invention.

FIG. 1 is a schematic block diagram showing a semiconductor memory device 1000 of an embodiment 1 of the invention.

Referring to FIG. 1, semiconductor memory device 1000 includes four memory cell planes M#0 to M#3 isolated from each other by central regions CR1 and CR2 which extend along long and short sides, respectively.

Each of memory cell planes M#0 to M#3 has a storage capacity, e.g., 16 Mbits. Thus, semiconductor memory device 1000 has a storage capacity of 64 Mbits.

Memory cell planes M#0 to M#3 include row decoders RD0 to RD3 for selecting word lines, respectively, which are opposed to first central region CR1 and are arranged along the long side, and also include column decoders CD0 to CD3 for generating column select signals, respectively, which are opposed to second central region CR2 and are arranged along the short side. In the first central region CR1, pads PD including data I/O terminals DQ are arranged at central region CR1 along the long side. Address signal input pads PDA receiving externally supplied address signals are arranged at central region CR1 between memory cell planes M#0 and M#2.

Similarly to the conventional semiconductor memory device, the semiconductor memory device 1000 includes, as will be described later, preamplifier/write-buffer circuits 7 for data input/output with respect to global I/O line pairs arranged in memory cell planes M#0 to M#3, read drivers 8 which amplify internal read data sent from preamplifier/write-buffer circuits 7 and transmit the same to corresponding read data buses, and a driver circuit 11 which receives signals on the read data buses and selectively transmits the same to an output buffer 13 via an output bus.

Further, the semiconductor memory device 1000 includes an address buffer 3 which receives an address signal externally applied via address input pads PDA and produces an internal address, an ATD generating circuit 4 which detects change in the internal address signal applied from address buffer 3 and generates an address change detection signal ATD, a PAE generating circuit 5 which is responsive to signal ATD to generate a signal PAE for activating preamplifier included in preamplifier/write-buffer 7, and an IOEQ generating circuit 6 which is responsive to signal ATD to generate an equalize instruction signal IOEQ for equalizing the potential level on global I/O line pair.

Semiconductor memory device 1000 further includes an internal voltage regulator 29 which receives an externally supplied power supply potential Vcc and issues an internal power supply potential, an output buffer 13 which receives an output of driver circuit 11 and drives the potential levels on data I/O terminals DQ ("DQ" generally indicates data I/O terminals DQ0–DQ15), and an input buffer 12 which receives data sent from data I/O terminal DQ and transmits the same to preamplifier/write-buffers 7.

Although the circuits described above are not shown in FIG. 1, they are arranged in the same manner as those in the conventional semiconductor memory device.

Figure 2:
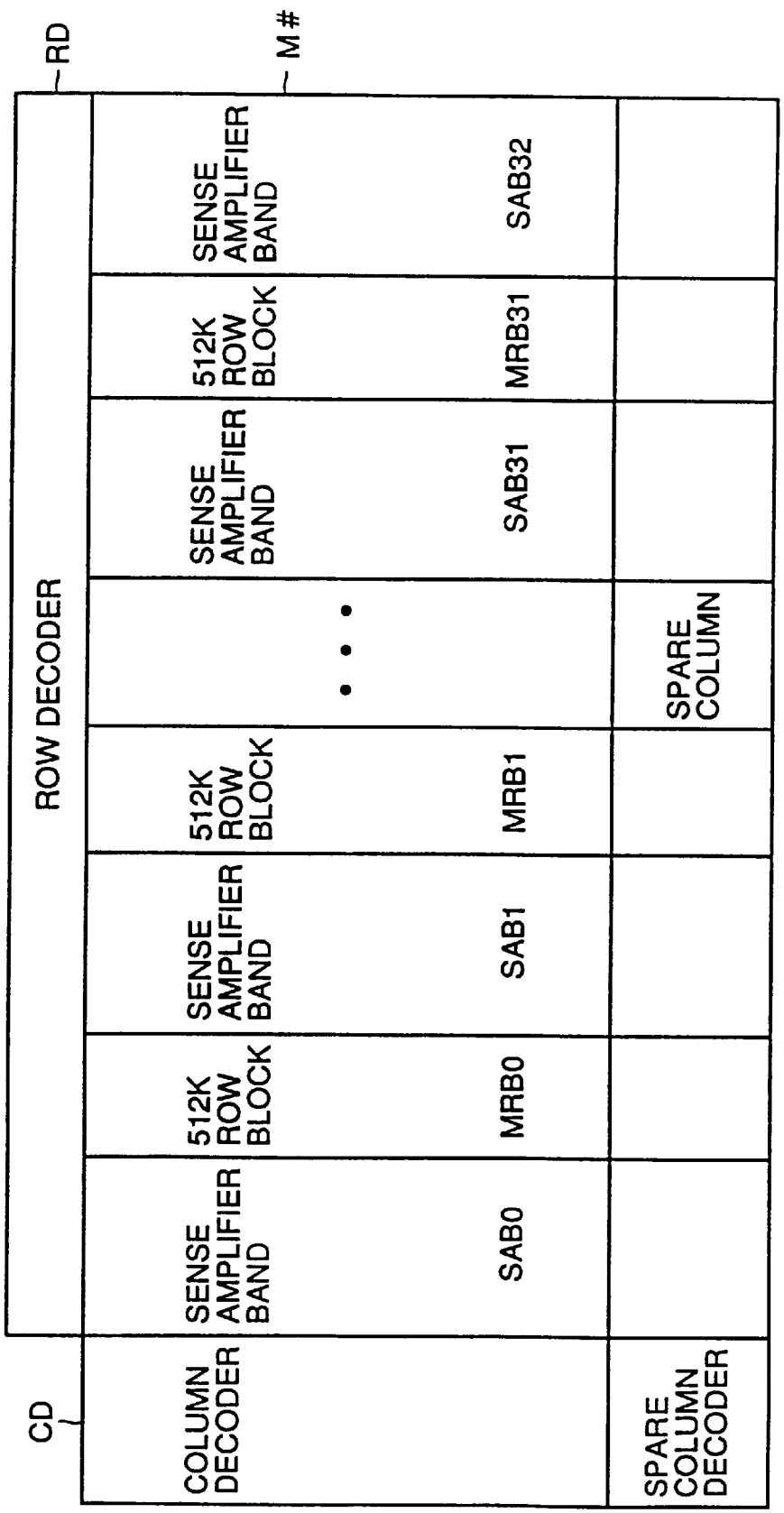
FIG. 2 specifically shows a structure of one memory cell plane shown in FIG. 1.

FIG. 2 specifically shows a structure of a portion related to one of memory cell planes M# ("M#" generally indicates M#0 to M#3).

In FIG. 2, each memory cell plane M# includes 32 row blocks MRB0–MRB31 each having memory cells of 512 Kbits. In each of row blocks MRB0–MRB31, the memory cells of 512 Kbits are arranged in a matrix form.

Sense amplifier bands SAB1–SAB31, which sense and amplify data of the memory cells selected in accordance with the external address signals, are disposed between row blocks MRB0–MRB31.

Sense amplifier bands SAB0 and SAB32 are arranged outside row blocks MRB0 and MRB31, respectively.

Sense amplifier bands SABi and SAB(i+1) arranged at opposite sides of each row block MRBi (i=0–31) sense and amplify data of the memory cells connected to one selected row in the same row block MRBi.

Thus, each of sense amplifier bands SAB1–SAB31 are commonly used by two row blocks.

Figure 3:
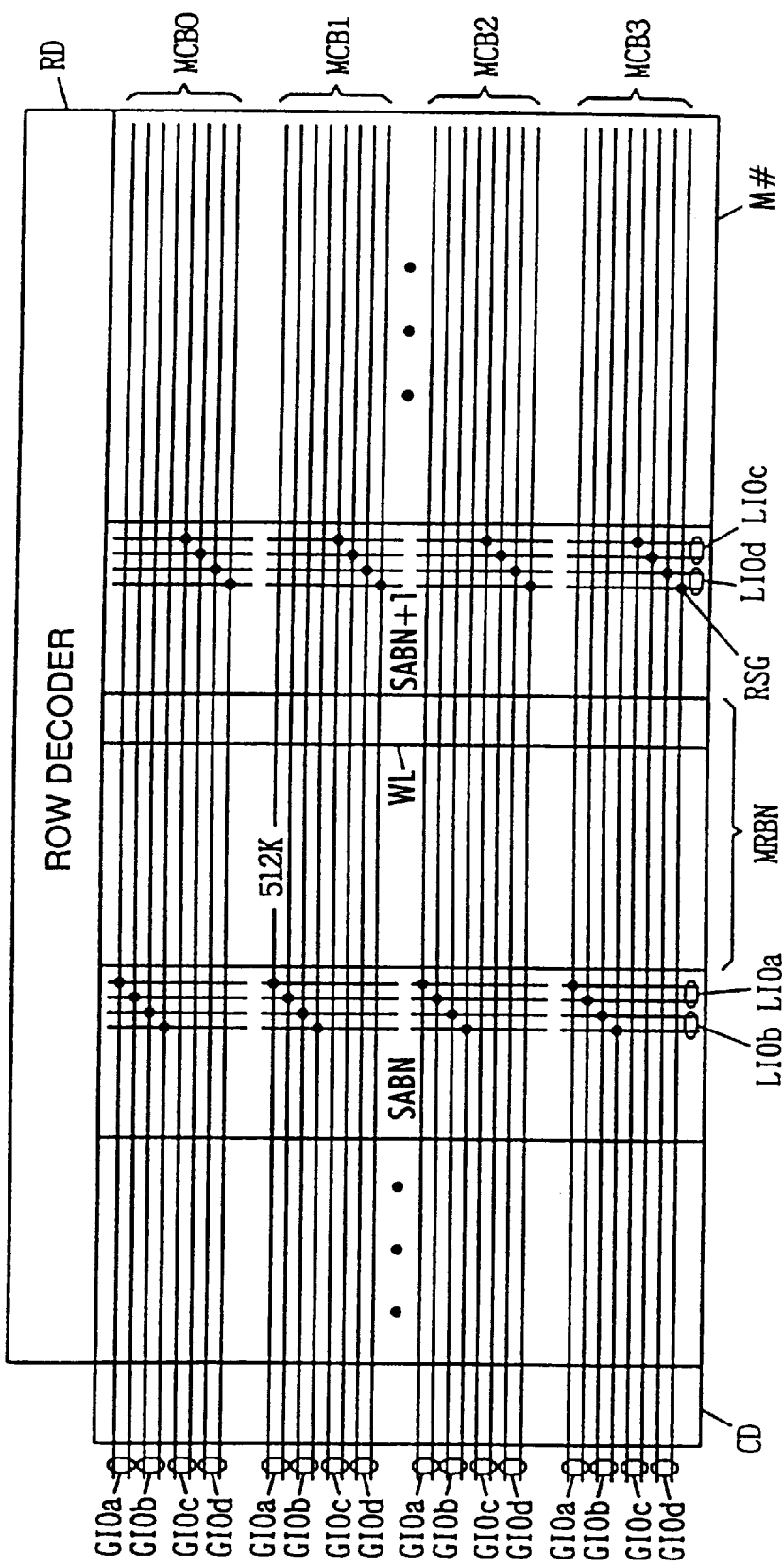
FIG. 3 schematically shows arrangement of global I/O line pairs and local I/O line pairs.

FIG. 3 shows an arrangement of I/O lines, i.e., internal data write/read lines in one memory cell plane.

Referring to FIG. 3, memory cell plane M# is divided into four column blocks MCB0 to MCB3. Four global I/O line pairs GIOa to GIOd are arranged for each of column blocks MCB0 to MCB3.

Global I/O line pairs GIOa to GIOd extend in the column direction through all the row blocks in the corresponding column block. In each row block (in FIG. 3, row block MRBN is shown as a representative example, word lines WL which transmit a row select signal sent from row decoder RD extend through column blocks MCB0–MCB3. Each word line WL is connected to memory cells (not shown) belonging to one row in the memory cell plane.

Sense amplifier bands SABN and SABN+1 are arranged at opposite sides in the column direction of row block MRBN. In each of sense amplifier bands SABN and SABN+1, there are arranged local I/O line pairs LIOa to LIOd which extend in the row direction through only each column block.

At each column block in row block MRBN, there are arranged four local I/O line pairs, i.e., local I/O line pairs LIOa, LIOb, LIOc and LIOd.

Local I/O line pairs LIOa to LIOd are connected to global I/O line pairs GIOa to GIOd arranged in the corresponding column block via row block line pair gates RSG which are represented by solid circles in FIG. 3, respectively. Row block select gates RSG are selected in accordance with row address signal bits for row block selection, respectively.

Figure 4:
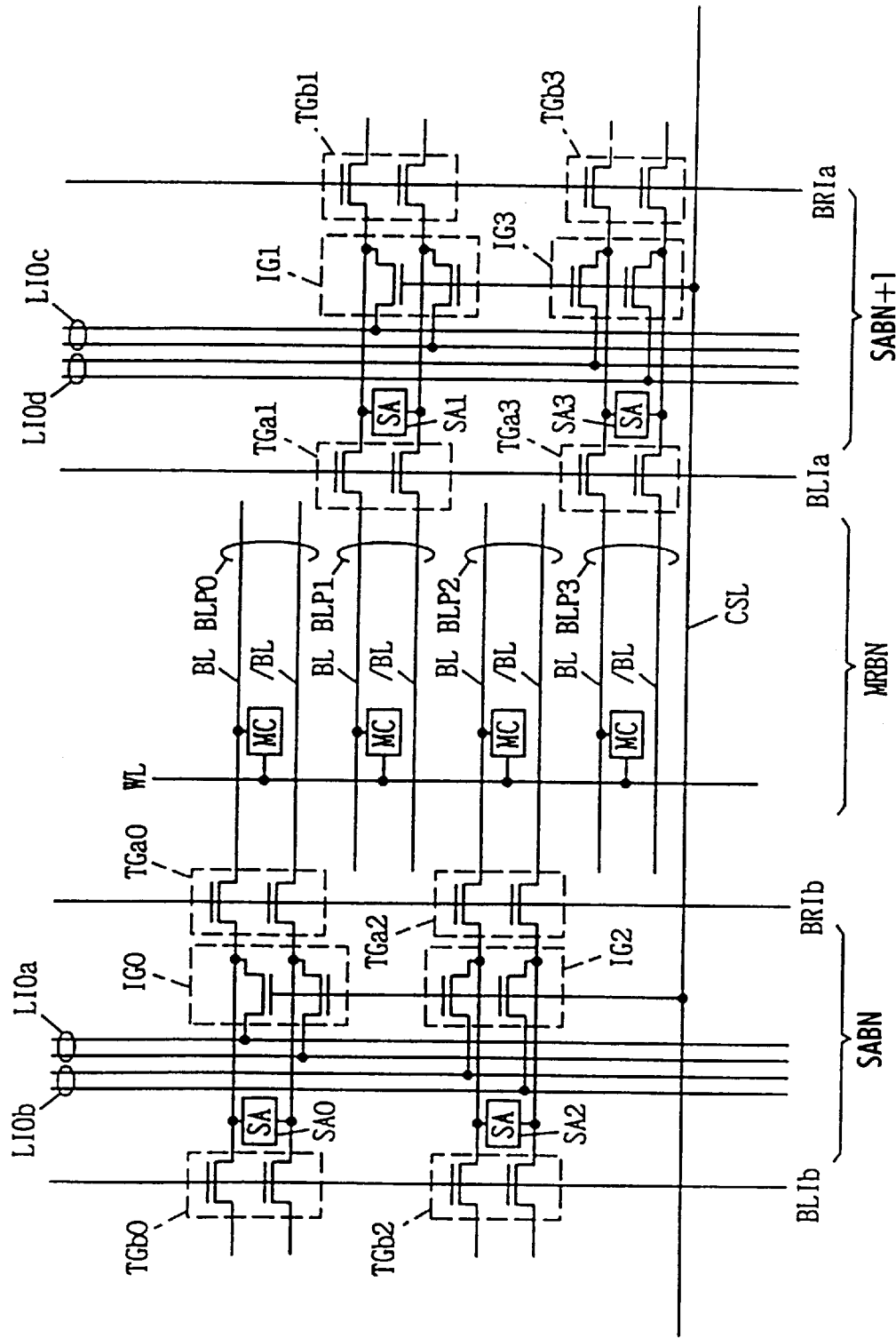
FIG. 4 specifically shows arrangement of sense amplifier bands shown in FIG. 3.

FIG. 4 is a circuit diagram specifically showing a structure of sense amplifier bands SABN and SABN+1 shown in FIG. 3.

FIG. 4 shows, as a representative example, a structure of a portion related to one column select line CSL. Column select line CSL is arrange in each of the column blocks MCB0 to MCB3 in FIG. 3, and extends through a plurality of row blocks.

Only column select line CSL in the column block selected in accordance with the externally applied address signal is selected to attain the potential level at "H" level.

Four bit line pairs BLP0–BLP3 are arranged for each column select line CSL. Each of bit line pairs BLP0–BLP3 includes bit lines BL and /BL transmitting data signals which are complementary to each other. Memory cells MC are arranged correspondingly to crossings between bit line pairs BLP0–BLP3 and word line WL.

FIG. 4 shows an example of arrangement in which memory cells MC are arranged correspondingly to crossings between bit lines BL and word line WL.

Bit line pairs BLP0 and BLP2 are connected to sense amplifiers SA0 and SA2 contained in sense amplifier band SABN via isolation gates TGa0 and TGa2, respectively, which are turned on in response to a bit line isolation control signal BRIb.

Bit line pairs BLP1 and BLP3 are connected to sense amplifiers SA1 and SA3 contained in sense amplifier band SABN+1 via isolation gates TGa1 and TGa3, respectively, which are turned on in response to a bit line isolation control signal BRIa.

Sense amplifiers SA in sense amplifier band SABN are connected to bit line pairs included in row block MRB(N−1) via isolation gates TGb0 and TGb2, respectively, which are turned on in response to isolation control signal BRIb.

Sense amplifiers SA included in sense amplifier band SABN+1 are connected to bit line pairs included in row block MRBN+1 via isolation gates TGb1 and TGb2, respectively, which are turned on in response to isolation control signal BRIa.

Sense amplifier SA is provided correspondingly to each bit line pair, and is commonly used by the bit line pairs in the row blocks adjacent to each other. In each row block MRBN, sense amplifiers SA are arranged alternately at opposite sides of the bit line pairs, and therefore form a so-called shared sense amplifier arrangement of an alternate arrangement type.

In sense amplifier band SABN, local I/O line pairs LIOa and LIOb are arranged parallel to word line WL, and extend through one column block.

In sense amplifier band SABN+1, local I/O line pairs LIOc and LIOd are arranged in a similar manner.

Column select gates IG0–IG3, which are turned on in response to the signal potential on column select line CSL, are arranged for sense amplifiers SA0–SA3, respectively. These column select gates IG0–IG3 are turned on to connect sense amplifiers SA0–SA3 to local I/O line pairs LIOa-LIOd, respectively, when the signal potential on corresponding column select line CSL is at "H" level indicating the selected state.

When row block MRBN is selected, bit line isolation control signals BLIa and BRIb attain "H" level, and bit line isolation control signals BRIa and BLIb attain "L" level. Thereby, bit line pairs BLP0–BLP3 are connected to sense amplifiers SA0–SA3, respectively.

In a standby state, all bit line isolation control signals BLIa, BLIb, BRIa and BRIb attain "H" level, and all isolation control gates TGa0–TGa3 and TGb0–TGb3 are turned on.

In a read operation and others, only the selected row block is connected to sense amplifier SA, so that a capacity of the bit line pair connected to sense amplifier SA is reduced, which allows a rapid sense operation and transmission of a sufficient read voltage (read data of the memory cell) to the sense node.

Local I/O line pairs LIOa–LIOd are connected to global I/O line pairs GIOa–GIOd in FIG. 3 which are arranged in the corresponding column groups (not shown in FIG. 4), respectively.

Figure 5:
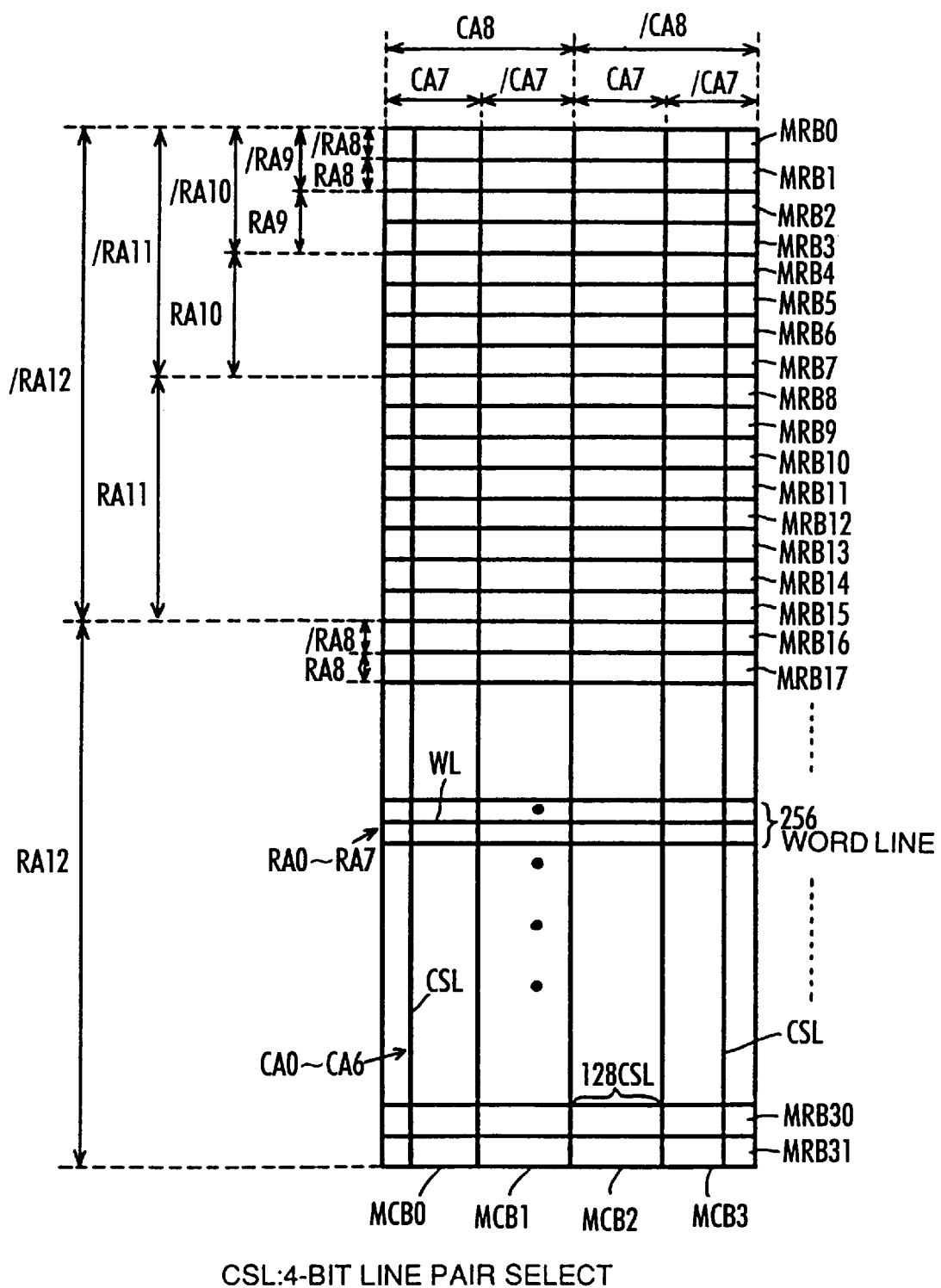
FIG. 5 shows allocation of address signals in a memory cell plane of the semiconductor memory device of the embodiment 1 of the invention.

FIG. 5 shows an example of allocation of address signal bits related to one memory cell plane shown in FIG. 1.

Referring to FIG. 5, allocation of the address signal bits in one memory cell plane is set such that designation of two column blocks in four column blocks is carried out by column address signal bits CA8 and /CA8.

Column address signal bits CA7 and /CA7 designate one between the two column blocks which are designated as described above.

Thirty-two row blocks MRB0–MRB31 shown in FIG. 2 are classified into a group including row blocks MRB0–MRB15 and a group including row blocks MRB16–MRB31. Row address signal bits RA12 and /RA12 selectively designate these two groups.

Row address signal bits RA8 and /RA8 to RA11 and /RA11 selectively designate one row block in the 16 row blocks belonging to the same group.

Each row block includes 256 word lines. One word line among these 256 word lines is designated in accordance with row address signal bits RA0–RA7.

Each column block includes 128 column select lines CSL. One among these 128 column select lines CSL is designated in accordance with column address signal bits CA0–CA6. As already discussed with reference to FIG. 4, each column select line CSL simultaneously selects four bit line pairs.

[Data Writing in Multibit Test Mode]

In accordance with allocation of addresses shown in FIG. 5, data is externally written through data transmission paths, which will now be described below.

Figure 6:
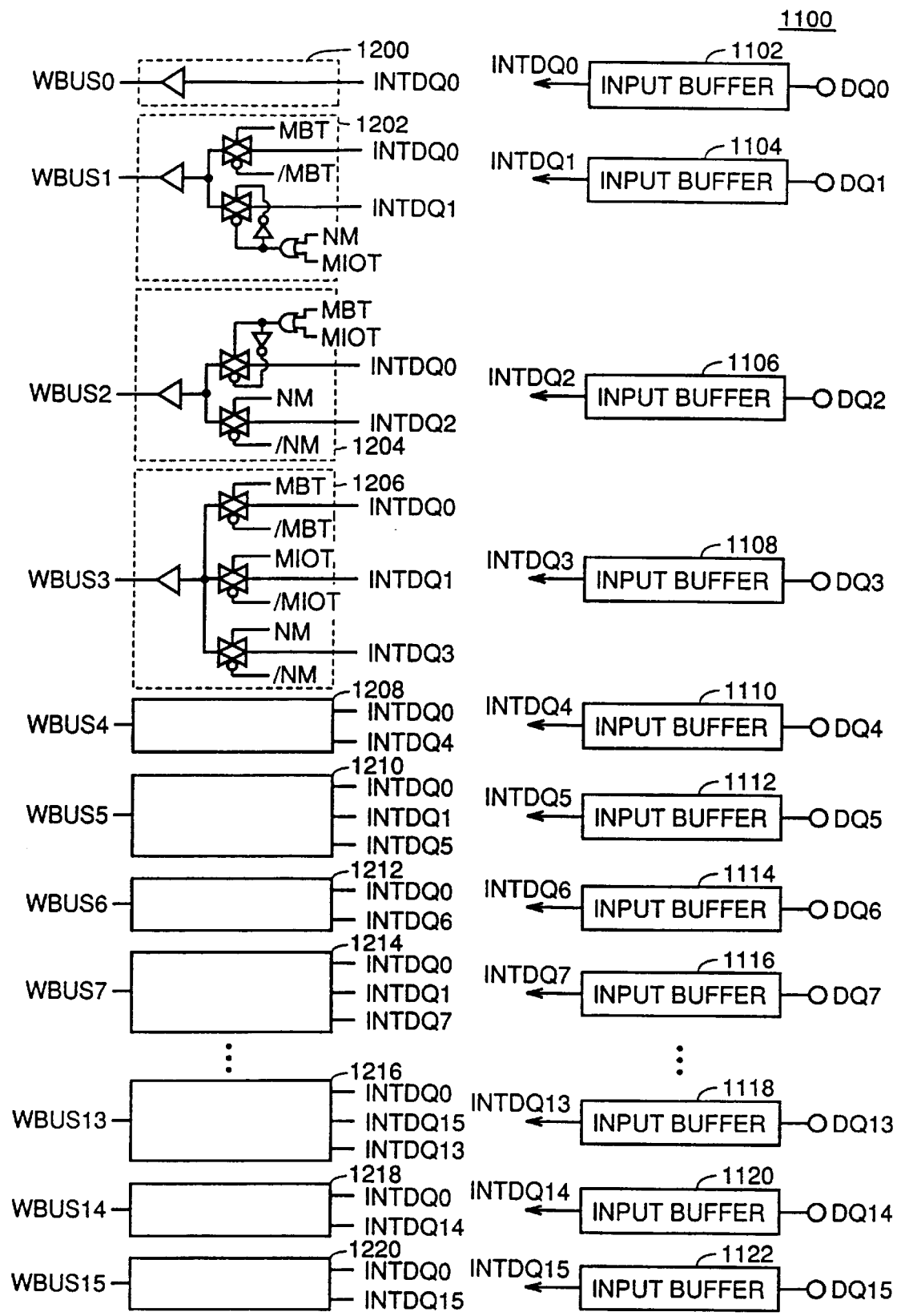
FIG. 6 is a schematic block diagram showing a structure of a data input buffer 1100.

FIG. 6 shows, in a functional manner, the data transmission paths of data from data I/O terminals DQ0–DQ15 to write data buses WBS0–WBS15 in semiconductor memory device 1000.

In the following operation, it is assumed that a signal MBT attains "H" level in a first multibit test mode which will be described later, i.e., in a mode that the memory cells of four bits are simultaneously selected in each of memory cell planes M#0–M#3, and the same data is written into the selected memory cells in all the memory cell planes.

In the second multibit test mode that predetermined write data is written into the memory cells of 4 bits which are selected simultaneously in each of memory cell planes M#1–M#3, it is assumed that signal MIOT attains "H" level.

Meanwhile, it is assumed that a signal NM attains "H" level during the normal operation mode in which data supplied from data I/O terminals DQ0, DQ2, DQ4 and DQ6 are written into memory cell plane M#0, data supplied from data I/O terminals DQ1, DQ3, DQ5 and DQ7 are written into memory cell plane M#1, data supplied from data I/O terminals DQ8, DQ10, DQ12 and DQ14 are written into memory cell plane M#2, and data supplied from data I/O terminals DQ9, DQ11, DQ13 and DQ15 are written into memory cell plane M#3.

Data supplied from data I/O terminals DQ0–DQ15 are converted into internal write data INTDQ0–INTDQ15 by corresponding input buffers 1102–1122, respectively.

Internal write data INTDQ0, which corresponds to the data supplied from data I/O terminal DQ0, is sent to a corresponding select circuit 1200. Regardless of the operation mode, select circuit 1200 drives the potential level on corresponding write data bus WBUSO in accordance with received signal INTDQ0.

A select circuit 1202 receives internal write data INTDQ0 and INTDQ1, and drives a corresponding write data bus WBUS1 in accordance with the operation mode. More specifically, when signal MBT is at "H" level in the first multibit test mode, select circuit 1202 drives the potential level on the corresponding write data bus WBUS1 in accordance with internal write data INTDQ0.

Meanwhile, when signal NM or MIOT is at "H" level in the normal operation mode or second multibit test mode, the potential level on write data bus WBUS1 is driven in accordance with internal write data INTDQ1.

Select circuits 1218 and 1220 respectively corresponding to write data buses WBUS14 and WBUS15 have structures similar to select circuit 1202 corresponding to write data bus WBUS1. A difference between them is only that select circuit 1218 corresponding to write data bus WBUS14 receives signals INTDQ0 and INTDQ14 as input signals, and select circuit 1220 corresponding to write data bus WBUS15 receive signals INTDQ0 and INTDQ15 as input signals.

In the first multibit test mode (i.e., while signal MBT is at "H" level), both select circuits 1218 and 1220 drive the potential levels on the corresponding write data buses in accordance with signal INTQO. Meanwhile, in the normal operation mode or second multibit test mode, select circuit 1218 drives corresponding write data buses WBUS14 and WBUS15 in accordance with signals INTDQ14 and INTDQ15, respectively.

Select circuit 1204 receives signals INTDQ0 and INTDQ2, and drives the potential level on the corresponding write data bus WBUS2 in accordance with the operation mode. More specifically, it drives the potential level on write data bus WBUS2 in accordance with signal INTDQ2 in the normal operation mode, and drives the potential level on the corresponding write data bus WBUS2 in accordance with signal INTDQ2 in the first and second multibit test modes.

Select circuit 1206 receives signals INTDQ0, INTDQ1 and INTDQ3, and drives the potential level on corresponding write data bus WBUS3 in accordance with the operation mode.

In the normal operation mode, select circuit 1206 drives the potential level on write data bus WBUS3 in accordance with input signal INTDQ3. Also, it drives the above potential in accordance with signal INTDQ0 in the first multibit test mode, and drives the above potential in accordance with signal INTDQ1 in the second multibit test mode.

Select circuits 1208 and 1212 corresponding to write data buses WBUS4 and WBUS6 have structures similar to that of select circuit 1204 corresponding to write data bus WBUS2. Only a difference is that select circuit 1208 receives signals INTDQ0 and INTDQ4 as inputs, and select circuit 1212 receives signals INTDQ0 and INTDQ6.

In the normal operation mode, select circuit 1208 drives write data bus WBUS4 in accordance with input signal INTDQ4, and select circuit 1212 drives the potential level on write data bus WBUS6 in accordance with input signal INTDQ6. Meanwhile, in the first and second multibit test modes, select circuits 1208 and 1212 drive the potential levels on corresponding write data buses WBUS4 and WBUS6 in accordance with signals INTDQ4 and INTDQ6, respectively.

Select circuits 1210 and 1214–1216 respectively corresponding to write data buses WBUS5, WBUS7, WBUS8, WBUS9, WBUS10, WBUS11, WBUS12 and WBUS13 have structures similar to that of select circuit 1206 corresponding to write data bus WBUS3.

In the normal operation mode, select circuits 1210 and 1214 to 1216 corresponding to write data buses WBUS5 and WBUS7 to WBUS13 drive the potential levels on the corresponding write data buses in accordance with input signals INTDQ5 and INTDQ7 to INTDQ13, respectively.

Meanwhile, in the first multibit test mode, all select circuits 1210 and 1214 to 1216 drive the potential levels on the corresponding write data buses in accordance with the signal INTDQ0.

In the second multibit test mode, select circuits 1210 and 1214 corresponding to write data buses WBUS5 and WBUS7 drive the corresponding write data buses in accordance with input signal INTDQ1, respectively, the select circuits corresponding to write data buses WBUS8, WBUS10 and WBUS12 drive the corresponding write data buses in accordance with input signal INTDQ14, respectively, and the select circuits respectively corresponding to write data buses WBUS9, WBUS11 and WBUS13 drive the corresponding write data buses in accordance with input signal INTDQ15.

The above operations can be summarized as follows. In the normal operation mode, the potential levels on write data buses WBUS0 to WBUS15 are drive in accordance with corresponding internal write data INTDQ0 to INTDQ15, respectively.

In the first multibit test mode, all the potential levels on write data buses WBUS0–WBUS15 are driven in accordance with internal write data INTDQ0 which corresponds to the write data applied to data I/O terminal DQ0.

In the second multibit test mode (i.e., while signal MIOT is at "H" level), write data buses WBUS0, WBUS2, WBUS4 and WBUS6 are driven in accordance with internal write data INTDQ0 which corresponds to the write data applied to data I/O terminal DQ0. Write data buses WBUS1, WBUS3, WBUS5 and WBUS7 are driven in accordance with internal write data INTDQ1 which corresponds to the write data applied to data I/O terminal DQ1. Write data buses WBUS8, WBUS10, WBUS12 and WBUS14 are driven in accordance with internal write data INTDQ14 which corresponds to the write data applied to data I/O terminal DQ14. Write data buses WBUS9, WBUS11, WBUS13 and WBUS15 are driven in accordance with internal write data INTDQ15 which corresponds to the write data applied to data I/O terminal DQ15.

In the first multibit test mode, the data applied to data I/O terminal DQ is written into all the selected memory cells of 4×4 bits. Meanwhile, writing of data into the simultaneously selected memory cells of 4 bits in each memory cell plane is performed independently from the other memory cell planes. More specifically, data supplied from data I/O terminal DQ0 is written into the memory cells in memory cell plane M#0, and data supplied from data I/O terminals DQ1, DQ14 and DQ15 are written into the memory cells in memory cell planes M#1, M#2 and M#3, respectively.

Figure 7:
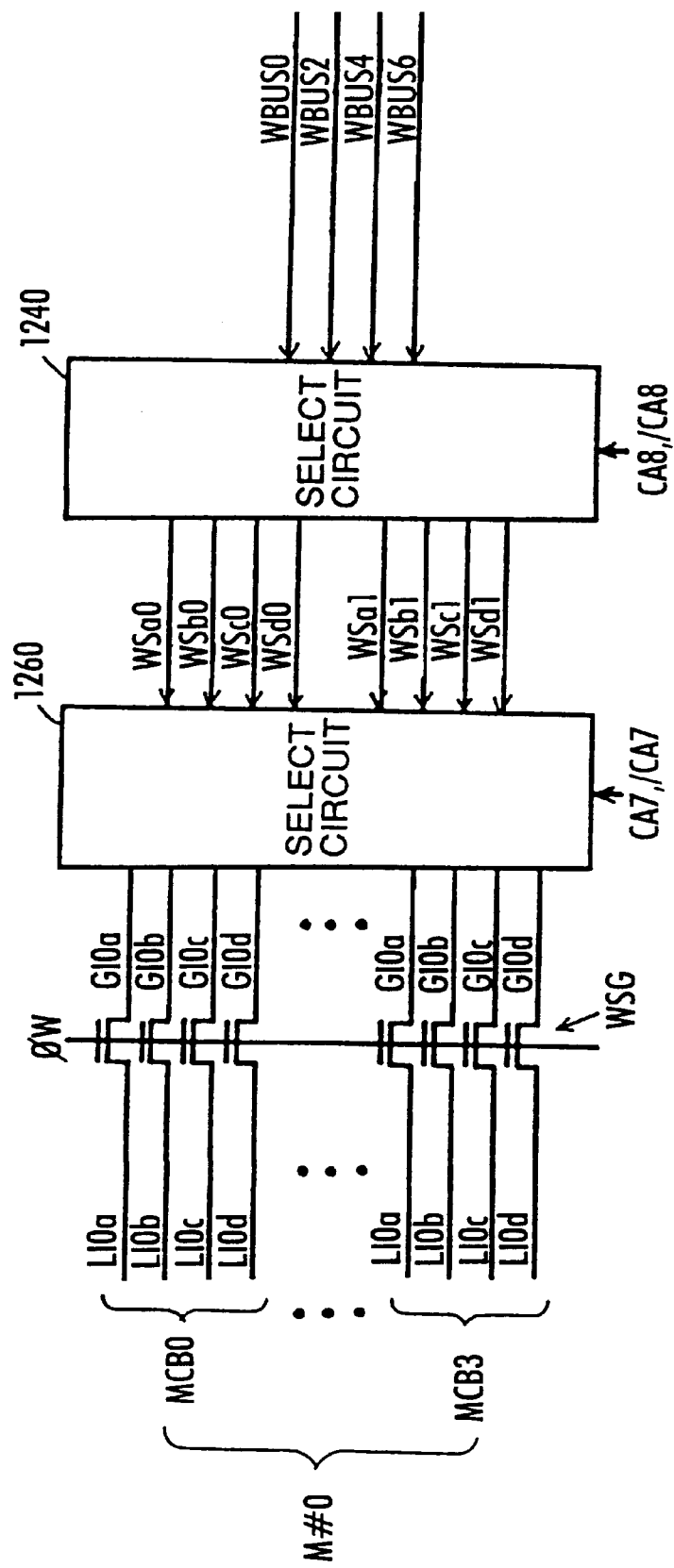
FIG. 7 shows data write paths in the semiconductor memory device 1000 in a functional manner.

FIG. 7 shows, in a functional manner, transmission paths of data from write data buses WBUS0, WBUS2, WBUS6 and WBUS8 to local I/O line pairs LIOa–LIOd belonging to memory cell plane M#0.

Local I/O line pairs LIOa–LIOd are present at each column block.

Data transmitted through write data buses WBUS0–WBUS6 is sent to corresponding write data buses WSa0–WSd0 or write data buses WSa1–WSd1 by a select circuit 1240 depending on a value of column address signal bit CA8.

Internal write data buses WSa0–WSd0 and WSa1–WSd1 are connected by a select circuit 1260 to global I/O line pairs GIOa–GIOd belonging to corresponding one of column blocks MCB0–MCB3 depending on column address signal bit CA7. Global I/O line pairs GIOa–GIOd are connected to corresponding local I/O line pairs LIOa–LIOd via row block select gate WSG which is turned on in response to row block select signal φw.

Therefore, data transmitted via write data buses WBUS0–WBUS6 is sent to local I/O line pairs LIOa–LIOd in the selected column block in response to column address signal bits CA8 and CA7.

Other memory cell planes M#1–M#3 have similar structures, and operate in such a manner that local I/O line pairs LIOa–LIOd belonging to the selected column block are connected to the corresponding write data buses in accordance with column address signal bits CA7 and CA8.

[Read Operation in Multibit Test Mode]

Description will now be given on structures of select paths, through which data is read and externally supplied from the memory cells selected in accordance with address allocation shown in FIG. 5, and the multibit test circuit for performing a multibit test on the data read from the selected memory cells.

Figure 8:
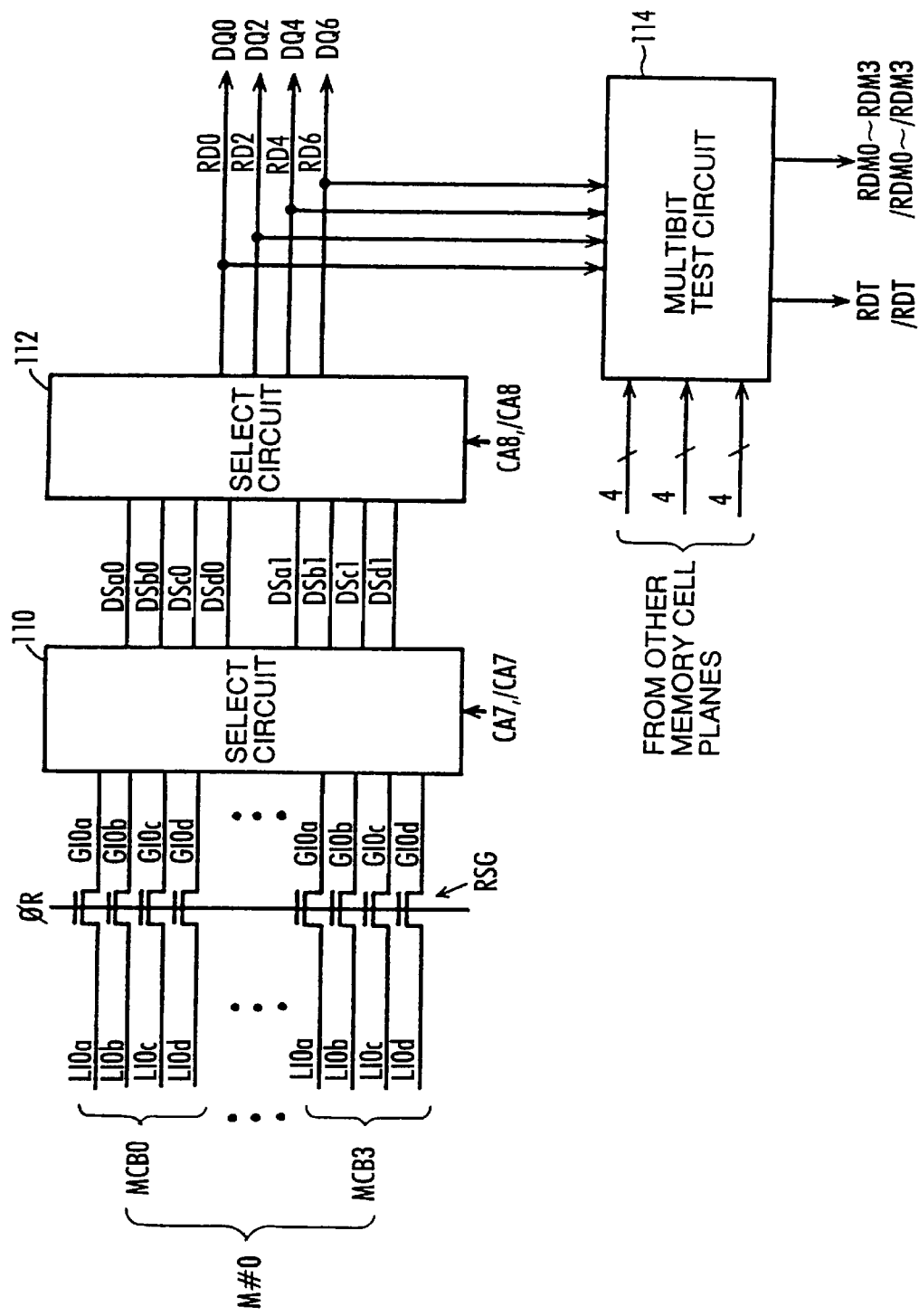
FIG. 8 shows data read paths in the semiconductor memory device 1000 in a functional manner.

FIG. 8 shows, in a functional manner, data transmission paths to data I/O terminals DQ0, DQ2, DQ4 and DQ6 from the local I/O lines in memory cell plane M#0 among the four memory cell planes in semiconductor memory device 1000 shown in FIG. 1.

Other memory cell planes M#1–M#3 have the same structures.

In one of the row blocks in memory cell plane M#0 shown in FIG. 8, four local I/O line pairs LIOa–LIOd provided for each of four column blocks MCB0–MCB3 are connected to the corresponding global I/O line pairs GIOa–GIOd via row block select gate RSG, which is turned on in response to row block select signal φR. Thus, in one row block, four local I/O line pairs LIOa–LIOd in each of column blocks MCB0–MCB3 are connected to the corresponding global I/O line pairs GIOa–GIOd, respectively.

A select circuit 110 is provided commonly for four sets of global I/O line pairs GIOa–GIOd, which correspond to column groups MCB0–MCB3, respectively.

Select circuit 110 selects the global I/O line pairs in even-numbered or odd-numbered column blocks in accordance with column address signal bits CA7 and /CA7. Thereby, global I/O line pairs GIOa–GIOd in the two column groups are selected and coupled to internal data buses DSa0–DSd0 and DSa1–DSd1. Thus, the select circuit 110 selects the memory cells of 8 bits in one memory cell plane.

For internal data buses DSa0–DSd1, there is provided a select circuit 112. Select circuit 112 selects internal data buses DSa0–DSd0 or DSa1–DSd1 in accordance with column address signal bits CA8 and /CA8, and couples the same to data I/O terminals DQ0, DQ2, DQ4 and DQ6. Thereby, memory cells of 4 bits are selected in each memory cell plane.

Similarly, memory cells of 4 bits are selected in each of memory cells M#1–M#3, so that memory cells of 16 bits in total are selected.

For example, data RD1, RD3, RD5 and RD7 read from memory cell plane M#1 are sent to data I/O terminals DQ1, DQ3, DQ5 and DQ7, respectively. Data RD8, RD10, RD12 and RD14 read from memory cell plane M#2 are sent to data I/O terminals DQ8, DQ10, DQ12 and DQ14, respectively. Likewise, data RD9, RD11, RD13 and RD15 read from memory cell plane M#3 are sent to data I/O terminals DQ9, DQ11, DQ13 and DQ15, respectively.

In the multibit test operation, data of the memory cells of 4 bits selected by select circuit 112 are sent in parallel to a multibit test circuit 114.

Multibit test circuit 114 receives memory cell data of 4 bits from each of four memory cell planes M#0–M#3. Therefore, multibit test circuit 114 determines match/mismatch of logics of the memory cell data of 16 bits, and issues signals RDT and /RDT indicative of the result of determination.

Multibit test circuit 114 determines match/mismatch of logics of 4-bit data simultaneously applied from memory cell plane M#0, and issues determination data RDM0 and /RDM0. Simultaneously, multibit test circuit 114 issues determination result data RDM1 and /RDM1 to RDM3 and /RDM3 in accordance with match/mismatch of logics of 4-bit data applied from other memory cell planes M#1–M#3, respectively.

The above determination result data may be externally sent via a dedicated pin terminal, or may be externally read via a path (not shown) and a data I/O circuit.

Figure 9:
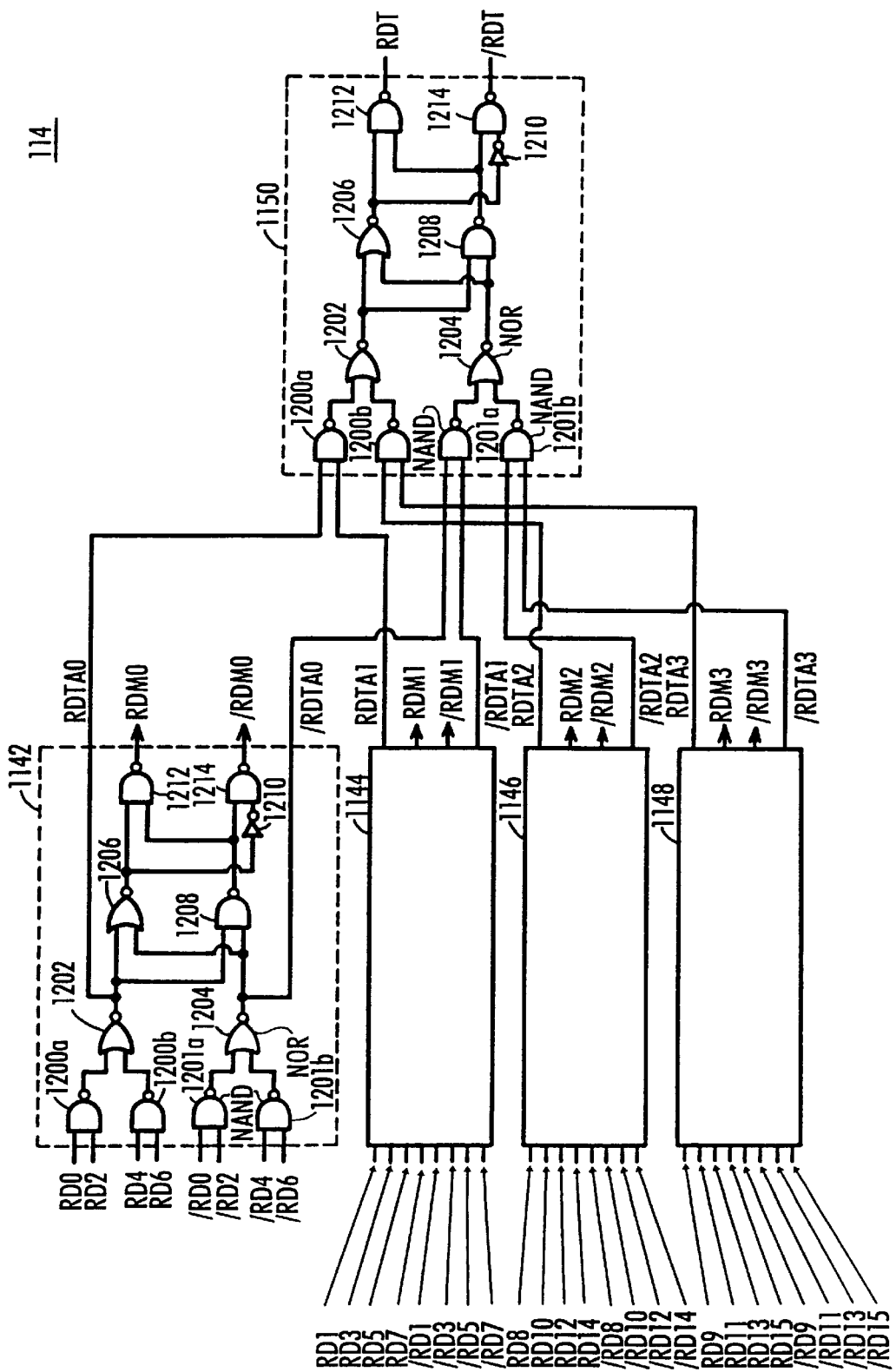
FIG. 9 is a schematic block diagram showing a structure of a multibit test circuit 114 shown in FIG. 8.

FIG. 9 is a schematic block diagram showing a structure of multibit test circuit 114 shown in FIG. 8.

Multibit test circuit 114 includes a first-stage determination circuit 1142, which receives read data RD0 and /RD0 to RD6 and /RD6 from memory cell plane M#0, and issues determination result data RDM0 and /RDM0 as well as internal signals RDTA0 and /RDTA0. As will be described later, determination result data RDM0 and /RDM0 are determination signals corresponding to match/mismatch of logics of the 4-bit data read from memory cell plane M#0, and, in other words, are data representing match/mismatch of logics of data read from the memory cells selected by one column select line in memory cell plane M#0.

Multibit test circuit 114 also includes a first-stage determination circuit 1144, which receives read data RD1 and /RD1 to RD7 and /RD7 from memory cell plane M#1, and issues internal signals RDTA1 and /RDTA1 as well as determination result data RDM1 and /RDM1 which correspond to match/mismatch of logics of the data sent from the memory cells selected by one column select line in one memory cell plane M#1.

Multibit test circuit 114 further includes first-stage determination circuits 1146 and 1148, which have structures similar to those of first-stage determination circuits 1142 and 1144. First-stage determination circuit 1146 receives read data RD8 and /RD8 to RD14 and /RD14 from memory cell plane M#2, and issues determination result data RDM2 and /RDM2 as well as internal signals RDTA2 and /RDTA2. First-stage determination circuit 1148 receives read data RD9 and /RD9 to RD15 and /RD15 from memory cell plane M#3, and issues determination result data RDM3 and /RDM3 as well as internal signals RDTA3 and /RDTA3.

Determination result data RDM2 and /RDM2 are signals which represent match/mismatch of logics of data read from the memory cells simultaneously selected by one column select line in memory cell plane M#2. Determination result data RDM3 and /RDM3 are signals which represent match/mismatch of logics of data read from the memory cells simultaneously selected by one column select line in memory cell plane M#3.

The multibit test circuit 114 further includes a subsequent-stage determination circuit 1150, which receives internal signals RDTAO and /RDTA0 to RDTA3 and /RDTA3, and issues determination result data RDT and /RDT corresponding to match/mismatch of logics of read data RD0–RD15 of 16 bits.

Structures of first-stage determination circuits 1142–1148 and subsequent-stage determination circuit 1150 will be described below more in detail.

Initial stage determination circuit 1142 includes an NAND circuit 1200a receiving read data RD0 and RD2, an NAND circuit 1200b receiving read data RD4 and RD6, an NAND circuit 1201a receiving inverted data /RD0 and /RD2 of read data RD0 and RD2, an NAND circuit 1201b receiving inverted data /RD4 and /RD6 of read data RD4 and RD6, an NOR circuit 1202 which receives outputs of NAND circuits 1200a and 1200b and issues an internal signal RDTA0, and a NOR circuit 1204 which receives outputs of NAND circuits 1201a and 1201b and issues inverted signal /RDTA0 of internal signal RDTA0.

First-stage determination circuit 1142 further includes an NOR circuit 1206 receiving outputs of NOR circuits 1202 and 1204, an NAND circuit 1208 receiving outputs of NOR circuits 1202 and 1204, an inverter 1210 receiving an output of NOR circuit 1206, an NAND circuit 1212 which receives outputs of NOR circuit 1206 and NAND circuit 1208, and issues determination data RDM0, and NAND circuit 1214 which receives outputs of NAND circuit 1208 and inverter circuit 1210, and issues inverted signal /RDM0 of internal signal RDM0.

Structures of first-stage determination circuits 1144, 1146 and 1148 are similar to that of first-stage determination circuit 1142, and will not be described below.

Subsequent-stage determination circuit 1150 has a structure basically similar to that of first-stage determination circuit 1142. Similar portions bear the same reference numbers, and will not be described below.

Subsequent-stage determination circuit 1150 differs from first-stage determination circuit 1142 in that NAND circuit 1200a receives, on its inputs, internal signals RDTA0 and RDTA1 sent from first-stage determination circuits 1142 and 1144, respectively, that NAND circuit 1200b receives, on its inputs, internal signals RDTA2 and RDTA3 sent from first-stage determination circuits 1146 and 1148, respectively, that NAND circuit 1201a receives, on its inputs, internal signals /RDTA0 and /RDTA1 sent from first-stage determination circuits 1142 and 1144, respectively, and that NAND circuit 1201b receives, on its inputs, internal signals /RDTA2 and /RDTA3 sent from first-stage determination circuits 1146 and 1148, respectively.

An operation of multibit test circuit 114 will be briefly described below.

Internal signal RDTAO issued from first-stage determination circuit 1142 attains "H" level only when all read data RD0, RD2, RD4 and RD6 attain "H" level. Internal signal /RDTA0 attains "H" level only when all read data /RD0, /RD2, /RD4 and /RD6 attain "H" level.

Therefore, in the multibit test, and particularly in the case where data at "H" level has been written into the memory cells to be tested, internal signals RDTA0 and /RDTA0 attain "H" and "L" levels, respectively, when a match is found in all the data read from memory cells of 4 bits which are simultaneously selected by the same column select line in memory cell plane M#0.

In the cases other than the above, internal signal RDTAO attains "L" level, and internal signal /RDTA0 attains "L" level.

When signal RDTA0 and /RDTA0 attain "H" and "L" levels in accordance with the value of internal signal RDTA0, respectively, determination data RDM0 and /RDM0 attain "H" and "L" levels, respectively.

Meanwhile, when signal RDTA0 and /RDTA0 attain "L" and "L" levels, respectively, determination data RDM0 and /RDM0 attain "L" and "H" levels, respectively.

As will be described later, a signal corresponding to determination data RDM0 is issued to data I/O terminal DQ0 in the second multibit test mode.

In this second multibit test mode, therefore, it is possible to determine, in accordance with determination data RDM0 issued to data I/O terminal DQ0, whether logics of the data read from the memory cells simultaneously selected by the same column select line match with each other or not.

In each of the other memory cell planes M#1–M#3, match/mismatch of logics of the data read from the memory cells simultaneously selected by the same column select line can be determined based on the determination data issued to data I/O terminals DQ1, DQ14 or DQ15.

Meanwhile, in the first multibit. test mode, it is possible to determine, in accordance with determination data RDT and /RDT issued from subsequent-stage determination circuit 1150, whether all the logics of data read from the simultaneously selected memory cells in all memory cell planes M#0–M#3 match with each other or not.

In the first multibit test mode, a signal depending on determination data RDT is issued to data I/O terminal DQ0.

Figure 10:
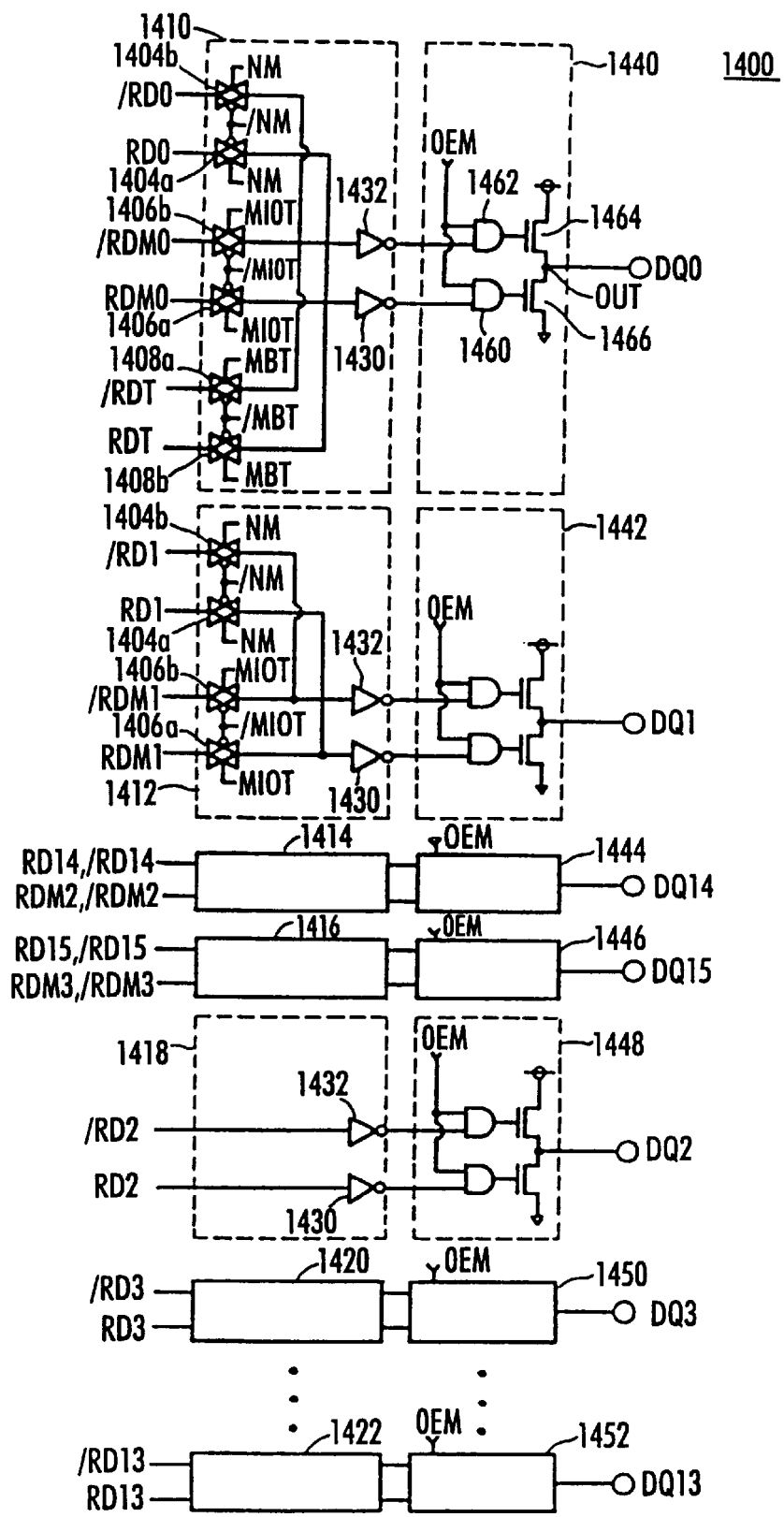
FIG. 10 is a schematic block diagram showing a structure of a data output buffer 1400.

FIG. 10 is a schematic block diagram showing a structure of a data I/O buffer corresponding to data I/O terminals DQ0–DQ15 shown in FIG. 1.

In an example of the structure of the data I/O buffer shown in FIG. 10, it is assumed that determination result data RDT is issued from data I/O terminal DQ0 in the first multibit test mode, and determination result data RDM0–RDM3 are issued from data I/O terminals DQ0, DQ1, DQ14 and DQ15 in the second multibit test mode, respectively.

Data I/O buffer 1400 includes a drive circuit 1440 and a select circuit 1410 corresponding to data I/O terminal DQ0. While a signal NM designating the normal operation mode is active, select circuit 1410 issues read data RD0 to drive circuit 1440. While signal MBT designating the first multibit test mode is active, it issues determination result data RDT and /RDT to drive circuit 1440. While signal MIOT designating the second multibit test mode is active, it issues determination result data RDM0 and /RDM0 to drive circuit 1440.

Drive circuit 1440 receives the output of select circuit 1410, and drives the potential level on data I/O terminal DQ0 in response to activation of signal OEM.

Data I/O buffer 1400 includes a select circuit 1412 and a drive circuit 1442 for data I/O terminal DQ1.

Select circuit 1412 issues read data RD1 and /RD1 while signal NM is active, and issues determination result data RDM1 and /RDM1 while signal MIOT is active. Drive circuit 1442 receives an output of select circuit 1442, and drives the potential level on data I/O terminal DQ1 in response to activation of signal OEM.

Data I/O buffer 1400 further includes a select circuit 1414 and a drive circuit 1444 for data I/O terminal DQ14 as well as a select circuit 1416 and a drive circuit 1446 for data I/O terminal DQ15.

Select circuits 1414 and 1416 have structures similar to that of select circuit 1412. Drive circuits 1444 and 1446 have structures similar to that of drive circuit 1442.

Data I/O buffer 1400 further includes select circuits 1418–1422 and drive circuits 1448–1452 which correspond to data I/O terminals DQ2–DQ13, respectively.

Select circuit 1418 receives read data RD2 and /RD2, and issues data formed by inverting them. Select circuits 1420–1422 have structures similar to that of select circuit 1418. Drive circuits 1448–1452 have structures similar to that of drive circuit 1440.

Structures of select circuits and drive circuits will be described below more in detail.

Select circuit 1410 provided for data I/O terminal DQ0 includes a transmission gate 1404a which receives read data RD0 and is turned on/off in accordance with signal NM, a transmission gate 1406a which receives determination result data RDM0 and is turned on/off in accordance with signal MIOT, a transmission gate 1408a which receives determination result data RDT and is turned on/off in accordance with signal MBT, and an inverter circuit 1430 which receives outputs of transmission gates 1404a–1408a, and issues data prepared by inverting them.

Select circuit 1410 also includes a transmission gate circuit 1404b which receives read data /RD0 and is turned on/off in accordance with signal NM, a transmission gate circuit 1406b which receives determination result data /RDM0 and is turned on/off in accordance with signal MIOT, a transmission gate circuit 1408b which receives determination result data /RDT and is turned on/off in accordance with signal MBT, and an inverter circuit 1432 which receives outputs of transmission gate circuits 1404b–1408b, and issues signals prepared by inverting them.

Drive circuit 1440 includes an AND circuit 1460 receiving the output of inverter circuit 1430 and signal OEM, an AND circuit 1462 receiving the output of inverter circuit 1432 and signal OEM, an N-channel MOS transistor 1464 which is connected between power supply potential Vcc and an output node OUT, and receives on its gate an output of AND circuit 1462, and an N-channel MOS transistor 1466 which is connected between output node OUT and the ground potential, and receives on its gate an output of AND circuit 1460. Output node OUT is connected to data I/O terminal DQ0.

While signal NM is at "H" level indicating the active state, the operation is performed as follows. When transmission gate circuits 1404a and 1404b are turned on, and signal OEM attains the active state ("H" level), N-channel MOS transistors 1464 and 1466 are complementarily turned on and off in accordance with read data RD0, so that the potential level on output node OUT changes.

Likewise, N-channel MOS transistors 1464 and 1466 are complementarily turned on and off in accordance with determination result data RDM0 while signal MIOT is active and hence at "H" level, and are complementarily turned on and off in accordance with determination result data RDT while signal MBT is at "H" level. Thereby, the potential level on output node OUT changes.

The structure of select circuit 1412 is similar to that of select circuit 1410 except for that it does not include transmission gates 1408a and 1408b. Similar portions bear the same reference numbers, and will not be described below.

Select circuit 1418 includes an inverter circuit 1430 which receives read data RD2 and issues a determination signal, and an inverter circuit 1432 which receives read data /RD2 and issues a determination signal. Therefore, select circuit 1418 operates merely as a buffer circuit for read data RD2 and /RD2.

Structures of drive circuits 1442–1452 are similar to that of drive circuit 1440. Similar portions bear the same reference numbers and will not be described below.

Owing to the structure of data I/O buffer shown in FIG. 10, data is sent selectively from data I/O terminals DQ0, DQ1, DQ14 and DQ15 in accordance with activation of respective signals NM, MBT and MIOT.

Description will be given on a manner of producing signals MBT and MIOT which control the operation of data I/o buffer 1400 shown in FIG. 10.

Figure 11:
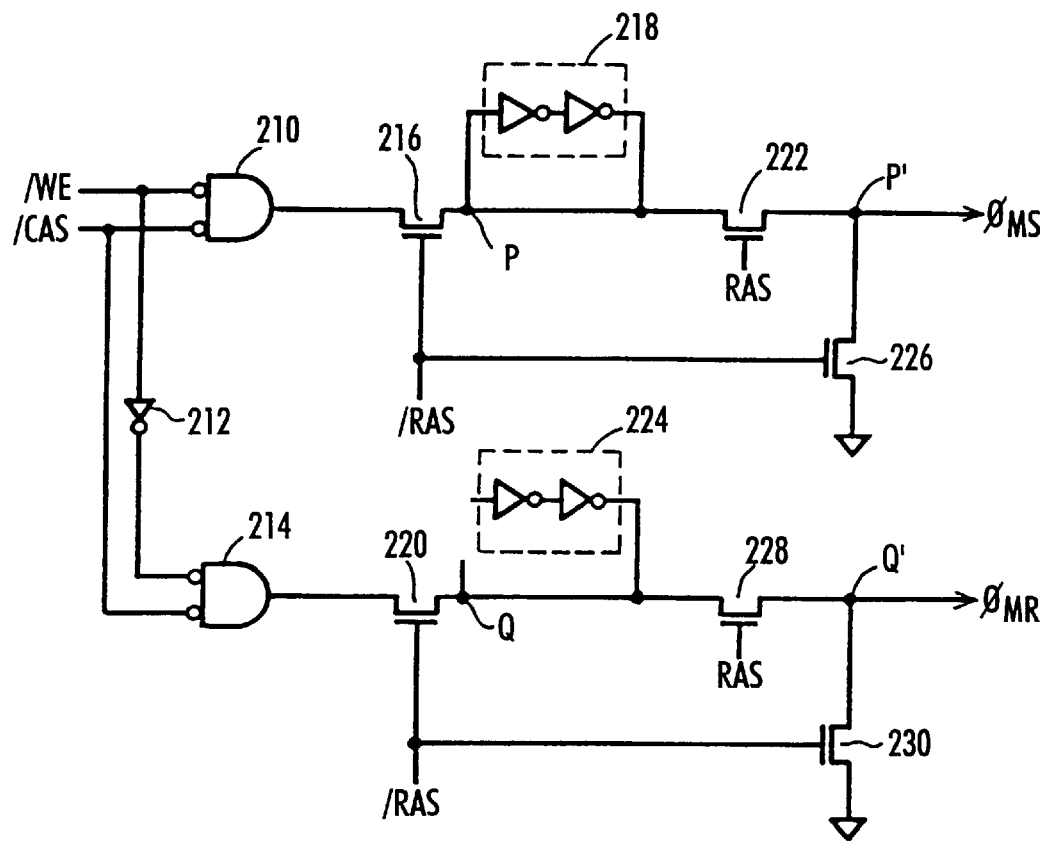
FIG. 11 is a first circuit diagram showing a structure of an internal control circuit 200.
Figure 12:
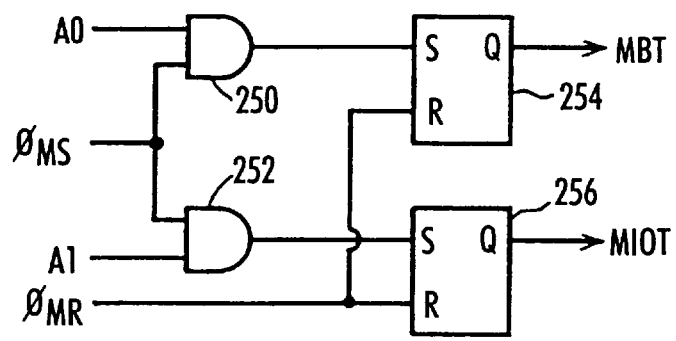
FIG. 12 is a second circuit diagram showing a structure of the internal control circuit 200.

FIGS. 11 and 12 are circuit diagrams showing a structure of an internal control circuit which selectively activates signals MBT and MIOT in accordance with external control signals /WE and /CAS as well as address signals A0 and A1. Signal /WE is a write enable signal for designating data writing. Signal ICAS is a column address strobe signal for enabling circuits which select columns in memory cell planes M#0–M#3.

Address signals A0 and A1 represent the lowest bit and the second lowest bit in the externally applied address signal.

Internal control circuit 200 includes an NOR circuit 210 receiving signals /WE and /CAS, an N-channel MOS transistor 216 which receives signal /RAS on its gate, and is connected at one of its source and drain to an output of NOR circuit 210, a latch circuit 218 which holds the potential level on a node P of the other of source and drain of N-channel MOS transistor 216, an N-channel MOS transistor 222 which receives signal RAS on its gate, is connected at one of its source and drain to node P, and is connected at the other of its source and drain to a node P' issuing internal control signal $\phi_{MS}$, and an N-channel MOS transistor 226 which is connected between node P' and the ground potential, and receives signal /RAS on its gate.

Internal control circuit 200 further includes an inverter 212 receiving signal /WE, an NOR circuit 214 receiving signal /CAS and an output of inverter 212, an N-channel MOS transistor 220 which receives signal /RAS on its gate, is connected at one of its source and drain to an output of NOR circuit 214, and is connected at the other of its source and drain to a node Q, an N-channel MOS transistor 228 which receives signal RAS on its gate, is connected at one of its source and drain to node Q, and is connected to the other of its source and drain to a node Q' issuing a signal $\phi_{MR}$, and an N-channel MOS transistor 230 which receives signal /RAS on its gate and is connected between node Q' and the ground potential.

Referring to FIG. 12, internal control circuit 200 further includes an AND circuit 250 receiving address signal A0 and signal $\phi_{MS}$, an AND circuit 252 receiving address signal A1 and signal $\phi_{MS}$, an SR flip-flop circuit 254 which receives an output of AND circuit 250 and signal $\phi_{MR}$ as set and reset signals, respectively, and issues signal MBT, and an SR flip-flop circuit 256 which receives an output of AND circuit 252 and signal $\phi_{MR}$ as set and reset signals, respectively, and issues signal MIOT.

Figure 13:
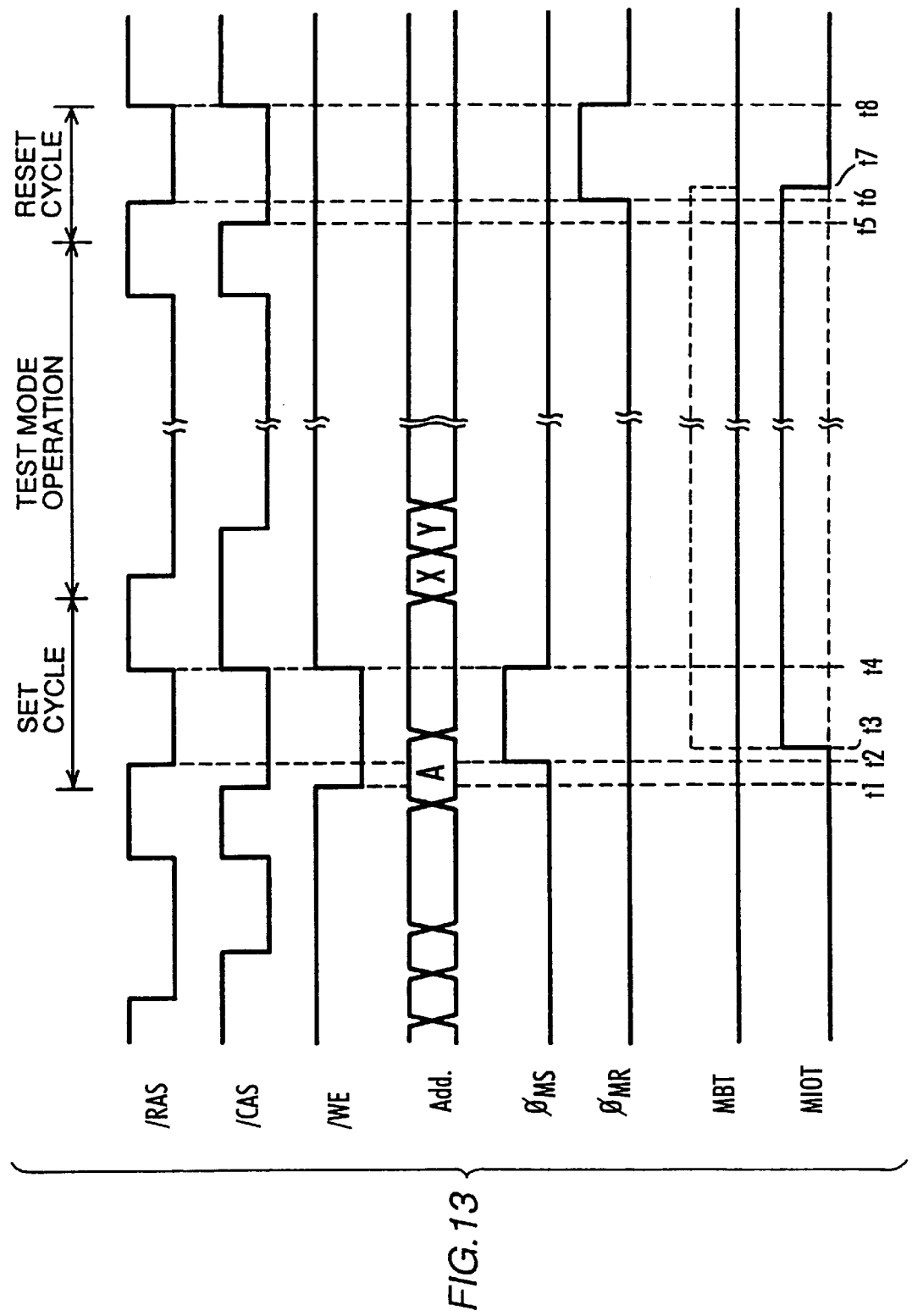
FIG. 13 is a timing chart for illustrating an operation of the internal control circuit 200.

An operation of internal control circuit 200 will be described below. FIG. 13 is a timing chart showing an operation of internal control circuit 200.

At time t1, signals /CAS and /WE fall from "H" level to "L" level. Thereafter, signal /RAS falls to "L" level at time t3. Thus, so-called WCBR conditions are set, and either signal MBT or signal MIOT is activated in accordance with the address signal value at the time of rising of signal /RAS. It is assumed that signal A1 is at "H" level at time t3.

During the period between times t1 and t2, the output of NOR circuit 210 is at "H" level in response to the fact that signals /WE and /CAS are both at "L" level. During the period between times t1 and t2, signal /RAS is at "H" level, and N-channel MOS transistor 216 is on, so that the potential level on node P is at "H" level. This potential level is held by latch circuit 218.

Meanwhile, node Q connected to the output node of NOR circuit 214 is at "L" level, and this potential level is held by latch circuit 224.

During the period between times t1 and t2, both N-channel MOS transistors 222 and 228 which receive signal RAS (i.e., inverted signal of signal /RAS) on their gates are off, and both N-channel MOS transistors 226 and 230 which receive signal /RAS on their gates are on. Therefore, both the potentials on nodes P' and Q' are at "L" level, and both signals $\phi_{MS}$ and $\phi_{MR}$ are at "L" level.

At time t2, when signal /RAS lowers from "H" level to "L" level, all N-channel MOS transistors 216, 220, 226 and 230 are turned off. Meanwhile, both N-channel MOS transistors 222 and 228 which receive signals RAS (inverted signal of signal /RAS) on their gates are turned on. At time t3, therefore, the potential level on node P' rises to "H" level, and the potential level on node Q' maintains "L" level. Thus, as shown in FIG. 13, signal changes its level into "H" at time t2.

At time t2, as shown in FIG. 12, address signal bit A1 is at "H" level, so that both signals $\phi_{MS}$ and A1 supplied to AND circuit 252 attain "H" level, and therefore AND circuit 252 changes its output level into "H". Therefore, the output level of SR flip-flop circuit 256 is set to "H" level.

Meanwhile, address signal bit A0 is at "L" level, so that AND circuit 250 maintains its output at "L" level, and therefore signal MBT issued from SR flip-flop circuit 254 maintains "L" level.

According to the above operations, signals MIOT and MBT, which control I/O buffer circuit 1400, are set to "L" level.

At time t4, signal /RAS attains "H" level. In response to this, both N-channel MOS transistors 226 and 230 are turned on, and both the potential levels on nodes P' and Q', i.e., levels of signals $\phi_{MS}$ and $\phi_{MR}$ attain "L" level.

Thereby, the set cycle in the second multibit test mode is completed.

In the test mode, operations subsequent to the above are performed as follows. For example, a row address signal is taken into the circuitry in a usual manner, i.e., in response to a falling edge of signal /RAS to "L" level, and a column address signal is taken into the circuitry in response to a falling edge of signal /CAS, whereby the test operation is performed.

When the test operation is completed, a reset cycle starts. In the reset cycle, signal /CAS falls to "L" level at time t5, and subsequently, signal /RAS falls to "L" level at time t6. Thus, so-called CBR conditions are set.

Between times t5 and t6, the output node of NOR circuit 214 attains "H" level, and the output node of NOR circuit 210 maintains "L" level. Similarly to the set cycle, signals $\phi_{MS}$ and $\phi_{MR}$ are issued at the falling edge of signal /RAS at time t6 in accordance with the potential levels on output nodes of NOR circuits 210 and 214 during this period between times t5 and t6. More specifically, at time t6, signal $\phi_{MS}$ maintains "L" level, and signal $\phi_{MR}$ rises to "H" level. In response to this, the output levels of SR flip-flop circuits 254 and 256 are reset, and, at time t7, signal MIOT attains "L" level.

At time t8, signals /RAS and /CAS return to "H" level. In response to this, signal $\phi_{MR}$ returns to "L" level.

The above description has been given on the operation of internal control circuit 200 in the second multibit test mode, i.e., in the case where signal MIOT is at "H" level. If address signal bits A0 and A1 are set to "H" and "L" levels at time t2, respectively, the internal control circuit 200 performs the operation in the first multibit test mode, i.e., the operation in which signal MBT is set to "H" level in the same manner.

Figure 14:
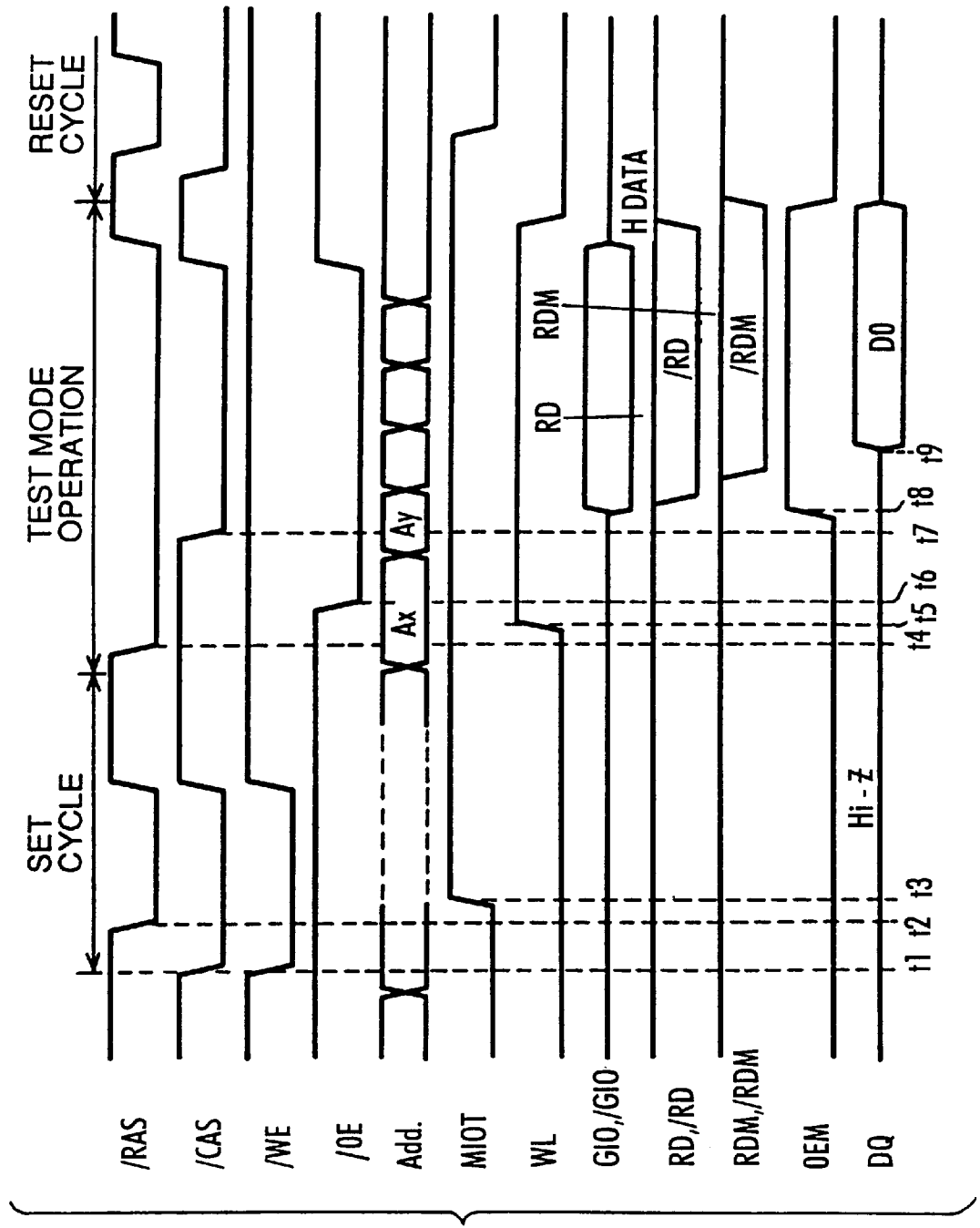
FIG. 14 is a timing chart for illustrating a multibit test operation of the semiconductor memory device 1000.

Referring to FIG. 14, more specific description will be given on the second multibit test mode, in which it is determined, in each memory cell plane, whether data read from the memory cells simultaneously selected by the same column select line match with each other or not, the determination result data for the memory cell planes are issued to data I/O terminals DQ0–DQ3, respectively.

FIG. 14 is a timing chart showing changes in major signals with a time in the second multibit test mode.

FIG. 14 shows, as a representative example, determination result data for data read from memory cell plane M#0, i.e., determination result data issued to data I/O terminal DQ0.

As already discussed with reference to FIG. 13, the second multibit test mode is set in accordance with-the WCBR conditions between times t1 and t2, and signal MIOT changes its level into "H".

During the read operation in the second multibit test mode after completion of the set cycle, a row address signal Ax is taken into the circuitry in response to falling of signal /RAS to "L" level at time t4. In response to this, the potential level on word line corresponding to address signal Ax changes into "H" level at time t5.

At time t6, output enable signal /OE designating data output is activated to attain "L" level.

At time t7, a column address Ay is taken into the circuitry in response to the falling edge of signal /CAS to "L" level. In response to column address Ay, a corresponding column select line is activated in each of memory cell planes M#0–M#3, and memory cells of 4 bits are selected per one column select line.

At time t8, signal OEM is activated to attain "H" level, and each of drive circuits 1440 and 1452 in I/O buffer circuit 1400 shown in FIG. 10 is activated.

Since the column select line is activated, data read from the selected memory cells is issued by select circuit 110 shown in FIG. 6 to corresponding data buses DSa0–DSd0 or DSa1–DSd1 via local I/O line pairs LIOa–LIOd and global I/O line pairs GIOa–GIOd . Further, select circuit 112 selects data of 4 bits per each memory cell plane and sends the same to multibit test circuit 114. Meanwhile, read data RD0 and /RD0 to RD6 and /RD6 are sent to corresponding select circuits among select circuits 1410 to 1422. Multibit test circuit 114 issues determination result data RDM0 and /RDM0 to RDM3 and /RDM3, which correspond to memory cell planes M#0–M#3, respectively, and depend on match/mismatch of logics of the read data. These determination result data are sent to the corresponding select circuits in I/O buffer circuit 1400, respectively.

In the second multibit test mode, select circuits 1410–1416 among those in data I/O buffer 1400, i.e., select circuits corresponding to data I/O terminals DQ0–DQ3 are controlled by signal MIOT to attain the state for selecting signals RDM0 and /RDM0 to RDM3 and /RDM3 sent from multibit test circuit 114.

Therefore, a signal corresponding, e.g., to determination result data RDM0, which corresponds to the data read from memory cell plane M#0, is issued from data I/O terminal DQ0 at time t9.

From the other data I/O terminals DQ1–DQ3, determination result data RDM1–RDM3 corresponding to memory cell planes M#1–M#3 are issued, respectively.

In the second multibit test mode, it is possible to determine match/mismatch of logics of data read from the memory cells, which are simultaneously selected in each memory cell plane by the activated column select line, in accordance with externally applied address signals Ax and Ay.

When it is determined, in accordance with the determination result data, that a defective memory cell is present among in the memory cells simultaneously selected by the single column select line, the memory cell column which is selected by this single column select line is handled as a unit, and is replaced with a spare memory cell column, so that it is possible to repair the defective memory cell column in the multibit test mode.

In the first multibit test mode, i.e., when signal MBT is activated to attain "H" level, select circuit 1410 in data I/O buffer 1400 corresponding to data I/O terminal DQ0 selects signals RDT and /RDT sent from the multibit test circuit. In the first multibit test mode, therefore, it is possible to determined match/mismatch of logics of data read from the memory cells of 4×4 bits, which are selected in the respective memory cell planes, in accordance with a value of data issued to data I/O terminal DQ0.

Owing to the structures described above, it is possible to achieve both the reduction of a test time and repairing of a defective memory cell column.

In the structure described above, one column select line can simultaneously select the memory cells of 4 bits in each memory cell plane. However, the invention is not restricted to this and can be applied to other structures.

[Embodiment 2]

In the embodiment 1, data read from column blocks MCB0–MCB3, for example, in memory cell plane M#0 is selected by select circuits 110 and 112, and then the multibit test circuit determines match/mismatch of the logics thereof.

However, select circuit 110 receives read data more the data which is supplied to multibit test circuit 114 shown in FIG. 8. Therefore, by determining match/mismatch of the logics of all of these input data, it is possible to perform the multibit test with a higher degree of degeneracy.

The embodiment 2 provides a semiconductor memory device, which allows the multibit test mode with a higher degree of degeneracy than the semiconductor memory device of the embodiment 1.

The semiconductor memory device of the embodiment 2 has a structure basically similar to that of semiconductor memory device 1000 shown in FIG. 1 except for data transmission paths between global I/O line pairs GIOa–G-IOd shown in FIG. 8 to multibit test circuit 114.

Figure 15:
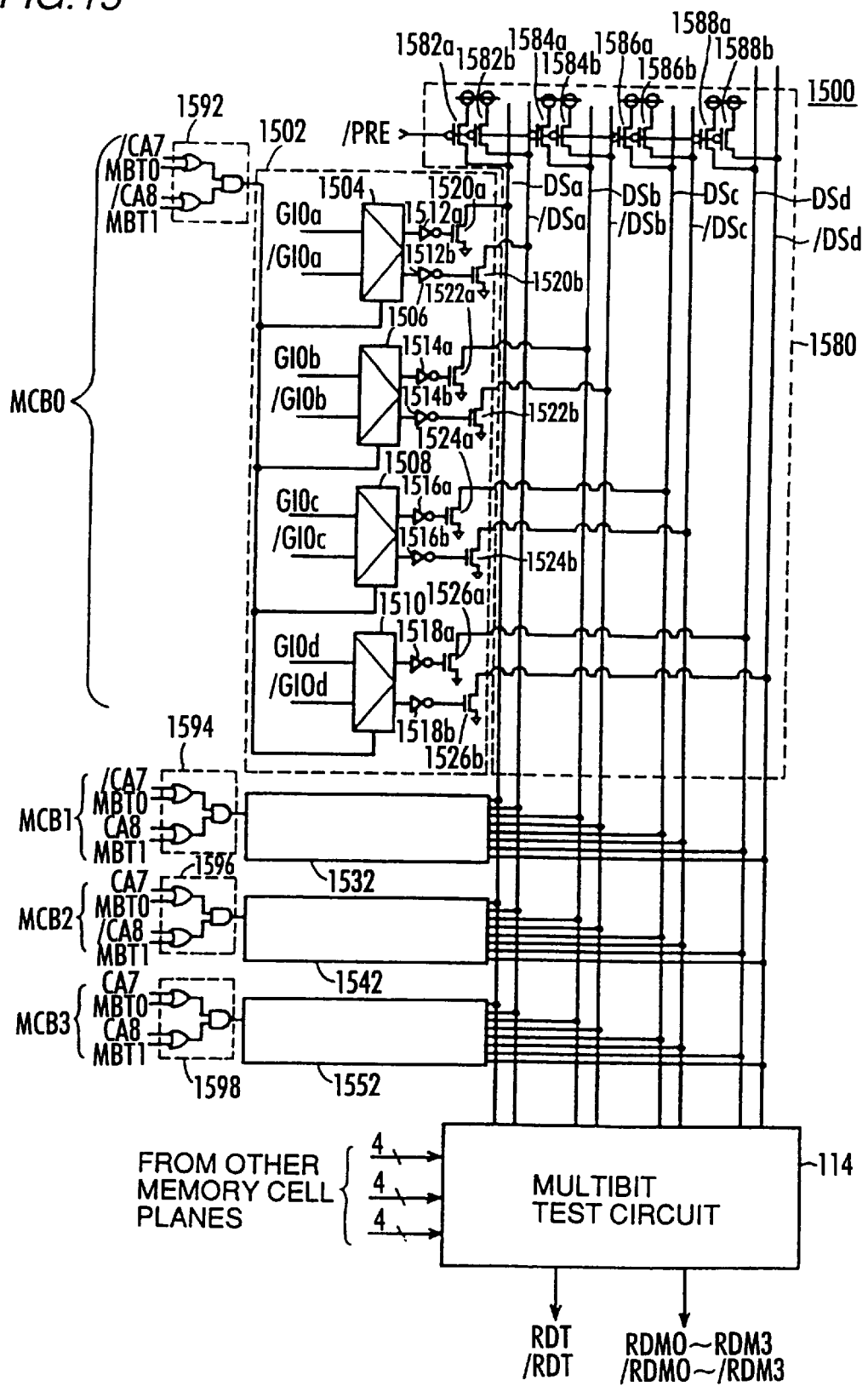
FIG. 15 is a schematic block diagram showing data transmission paths in a semiconductor memory device of an embodiment 2.

FIG. 15 is a circuit diagram showing a major portion of transmission paths from global I/O line pairs GIOa and /GIOa to GIOd and /GIOd to multibit test circuit 114 in the semiconductor memory device of the embodiment 2 of the invention.

A data transmission circuit 1500 shown in FIG. 15 includes read amplifier circuits 1502–1562 which receive data read from memory cell planes M#0–M#3, and a data bus 1580 which receives the output data from read amplifier circuit 1502–1562, and applies the corresponding data to multibit test circuit 114.

Read amplifier circuit 1502 includes a differential amplifier circuit 1504 which makes a connection between the input node and global I/O line pair GIOa and /GIOa transmitting read data from column block MCB0, a differential amplifier circuit 1506 which makes a connection between the input node and global I/O line pair GIOb and /GIOb transmitting read data from column block MCB0, a differential amplifier circuit 1508 which makes a connection between the input node and global I/O line pair GIOc and /GIOc, and a differential amplifier circuit 1510 which makes a connection between the input node and global I/O line pair GIOd and /GIOd. Differential amplifier circuit 1504 drives inverter circuits 1512a and 1512b with its complementary outputs, respectively. Likewise, differential amplifier circuits 1506, 1508 and 1510 drive inverter circuits 1514a and 1514b, 1516a and 1516b, and 1518a and 1518b with their complementary outputs, respectively.

Inverter circuit 1512a drives a gate potential of N-channel MOS transistor 1520a having a source connected to the ground node, and inverter circuit 1512b drives a gate potential of N-channel MOS transistor 1520b having a source connected to the ground node.

Likewise, inverter circuit pairs 1514a and 1514b, 1516a and 1516b, and 1518a and 1518b drive ground potentials of N-channel MOS transistors 1522a and 1522b, 1524a and 1524b, and 1526a and 1526b having sources connected to the group potentials, respectively.

Differential amplifier circuits 1504–1510 each are activated in accordance with data address signal bits CA7 and CA8 as well as test mode signals MBT0 and MBT1.

More specifically, in the case where both test mode signals MBT0 and MBT1 are inactive ("L" level), read amplifier circuit 1502 is activated when both address signal bits CA7 and CA8 are at "L" level and both signals /CA7 and /CA8 are at "H" level.

Read amplifier circuits 1532 to 1552 have structures similar to that of read amplifier circuit 1502, and include differential amplifier circuits which are activated in response to test mode signal MBT0 and MBT1 as well as address signal bits CA7 and CA8.

Data bus 1580 includes data buses DSa and /DSa connected to drains of N-channel MOS transistors 1520a and 1520b in each read amplifier circuit, which are driven by signals transmitted via global I/O line pair GIOa and /GIOa.

Data bus 1580 further includes data buses DSb and /DSb connected to drains of N-channel MOS transistors 1522a and 1522b in each read amplifier circuit, which are driven by signals transmitted via global I/O line pair GIOb and /GIOb, data buses DSc and /DSc connected to drains of N-channel MOS transistors 1524a and 1524b in each read amplifier circuit, which are driven by signals transmitted via global I/O line pair GIOc and /GIOc, and data buses DSd and /DSd connected to drains of N-channel MOS transistors 1526a and 1526b in each read amplifier circuit, which are driven by signals transmitted via global I/O line pair GIOd and /GIOd.

Therefore, with respect to data buses DSa and /DSa, a so-called wired OR structure is employed in which the potentials on them are driven in accordance with the outputs from respective read amplifier circuits 1502–1552. Other data buses DSb and /DSb to DSd and /DSd employ similar structures.

In data bus 1580, data buses DSa and /DSa to DSd and /DSd include precharge transistors 1582a and 1582b to 1588a and 1588b, respectively, which are turned on in response to a precharge signal /PRE and charge the corresponding data buses to power supply potential Vcc.

At a timing preceding the data output from corresponding read amplifier circuits, therefore, these data buses are charged to the power supply potential in accordance with activation of precharge signal /PRE (change to "L" level).

Data buses DSa and /DSa to DSd and /DSd transmit data to multibit test circuit 114.

Multibit test circuit 114 receives, in addition to the data of 4 bits sent from memory cell plane M#0, data of 4 bits from each of memory cell planes M#1–M#3, and thus receives data of 4×4 bits in total to issue determination result data in accordance with match/mismatch of logics of the received data.

In the same manner as the multibit test circuit 114 of the embodiment 1, the first multibit test mode is performed such that determination result data RDT and /RDT are issued in accordance with match/mismatch of logics of 4×4-bit data read from memory cell planes M#0–M#3, and the second multibit test mode is performed such that determination result data pairs RDM0 and /RDM0 to RDM3 and /RDM3 each are issued in accordance with match/mismatch of logics of 4-bit data read from corresponding one of memory cell planes M#0–M#3.

A amplifier activation signal generating circuit 1592 for activating differential amplifier circuits 1504–1510 in read amplifier circuit 1502 issues a logical product of a result of OR-operation of signal /CA7 and signal MBT0 and a result of OR-operation of signal /CA8 and signal MBT1.

Amplifier activating signal generating circuits 1594–1598 for remaining read amplifier circuits 1532–1552 have the same structures except for combination of logics of column address signal bits CA7 and CA8.

An operation of data transmission circuit 1500 will be described below.

(i) Both signals MBT0 and MBT1 are at "L" level.

In this case, and particularly, for example, if (CA7, CA8)=(0, 0) and therefore (/CA7, /CA8)=(1, 1), the output signal of amplifier activating signal generating circuit 1592 is activated to attain "H" level. Therefore, read amplifier circuit 1502 is activated, and data read from column block MCB0 is transmitted onto data buses DSa and /DSa to DSd and /DSd. It is now assumed that the potentials on global I/O lines GIOa and /GIOa are, for example, at "L" level and "H" level in accordance with read data, respectively. In this case, N-channel MOS transistors 1520a and 1520b are turned on and off in accordance with the output of differential amplifier circuit 1504, respectively. Therefore, data buses DSa and /DSa, which have been precharged to power supply potential Vcc, attain the potentials at "L" and "H" level, respectively. This potential level change is transmitted to multibit test circuit 114.

Similar operation is also performed with respect to other global I/O line pairs GIOb and /GIOb to GIOd and /GIOd.

In accordance with combination of logic levels of column address signal bits CA7 and CA8, one of read amplifier circuits 1532–1552 is activated.

(ii) Signal MBT0 is at "L" level, and signal MBT1 is at "H" level.

In this case, the potential level of the amplifier activating signal changes independently of the logic level of column address signal bit CA8. For example, in both the cases where column address signal bit CA8 is at "H" level and "L" level, the amplifier activating signal issued from amplifier activating signal generating circuit 1592 is active when column address signal bit CA7 is at "L" level, and is inactive when column address signal bit CA7 is at "H" level.

For example, when column address signal bit CA7 is at "L" level, read amplifier circuits 1502 and 1532 are simultaneously activated.

In this case, data buses DSa and /DSa transmit signals at "H" level, only when data transmitted by both global I/O lines GIOa and /GIOa are at "H" level in read amplifier circuits 1502 and 1532.

In this case, therefore, all the input signals to multibit test circuit 114 are at "H" level only when all the data transmitted through global I/O line pairs GIOa and /GIOa to GIOd and GIOd in column blocks MCB0 and MCB1 are at "H" level. Thus, multibit test circuit 114 is supplied with results of AND-operation of data read from the respective column blocks.

In the case where signal MBT0 and MBT1 are at "H" level and "L" level, respectively, the operation is performed in a similar manner except for that column address signal bit CA7 is ignored instead of bit CA8.

(iii) Both signals MBT0 and MBT1 are at "H" level.

In this case, all read amplifier circuits 1502–1552 are activated independently of values of column address signal bits CA7 and CA8.

Therefore, data buses DSa and /DSa transmit signals at "H" level only when all the data transmitted through global I/O line pairs GIOa and /GIOa are at "H" level in all column blocks MCB0–MCB3.

Similar operations are performed with respect to other data buses DSb and /DSb to DSd and /DSd.

In this operation mode, therefore, multibit test circuit 114 can simultaneously detect match/mismatch of logical values of data read from the memory cells of 4×4 bits in each memory cell plane, and it is possible to perform the multibit test of data read from the memory cells of 16×4=64 bits in total.

In the semiconductor memory device of the embodiment 2, as described above, it is possible, in accordance with the values of signals MBT0 and MBT1, to change the number of bits for one test between 16 (4×4), which is the bit number of memory cells in the mode for performing the multibit test on the data read therefrom, similarly to the embodiment 1, and 64 (16×4), which is the bit number of memory cells in the mode for performing the multibit test on the data read therefrom.

In this case, determination result data pairs RDM0 and /RDM0 to RDM3 and /RDM3 corresponding to match/mismatch of the logics each are issued for the data read from the memory cells which are simultaneously selected by the single column select line for each memory cell plane, and, in other words, are issued in the state that data of 4 bits are read from each memory cell plane. Consequently, when there is a memory cell column having a defective memory cell, this memory cell column can be replaced together with the memory cell columns, which are selected simultaneously by the same column select line, with the spare memory cell columns.

According to the semiconductor memory device of the embodiment 2, the multibit test for each memory cell plane can be carried out on a variable number of bits for detecting match/mismatch of logics of the data simultaneously read therefrom. Therefore, in the case where the multibit test is performed in such a mode that, for example, two column lines are simultaneously activated in each memory cell plane, replacement with the spare memory cell column can be performed in units each including the memory cell columns selected by these two column select lines, when a defective memory cell is found.

In this case, the test can be performed more rapidly.

Likewise, if such a test mode is employed that four column select lines are activated simultaneously in each memory cell plane, replacement with the spare memory cell columns can be performed in units each including the memory cell columns selected by these four column select lines.

Figure 16:
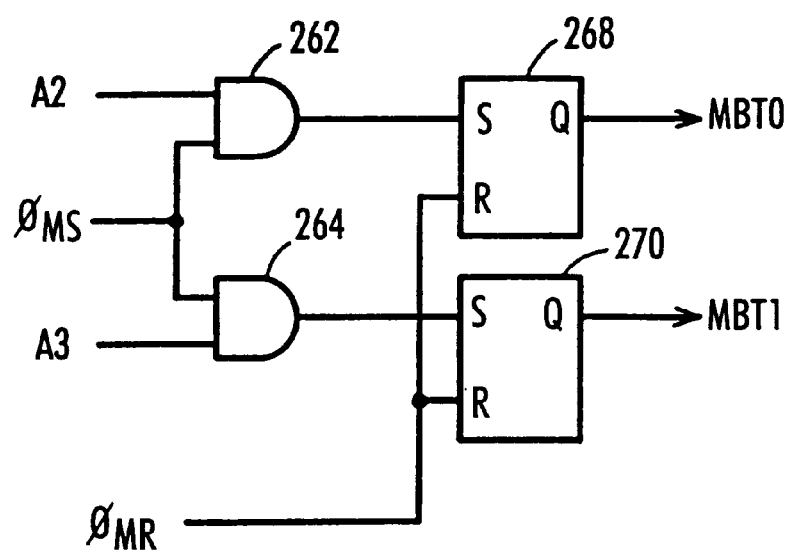
FIG. 16 is a schematic block diagram showing a structure of a control circuit 600 of an embodiment 2.
Figure 17:
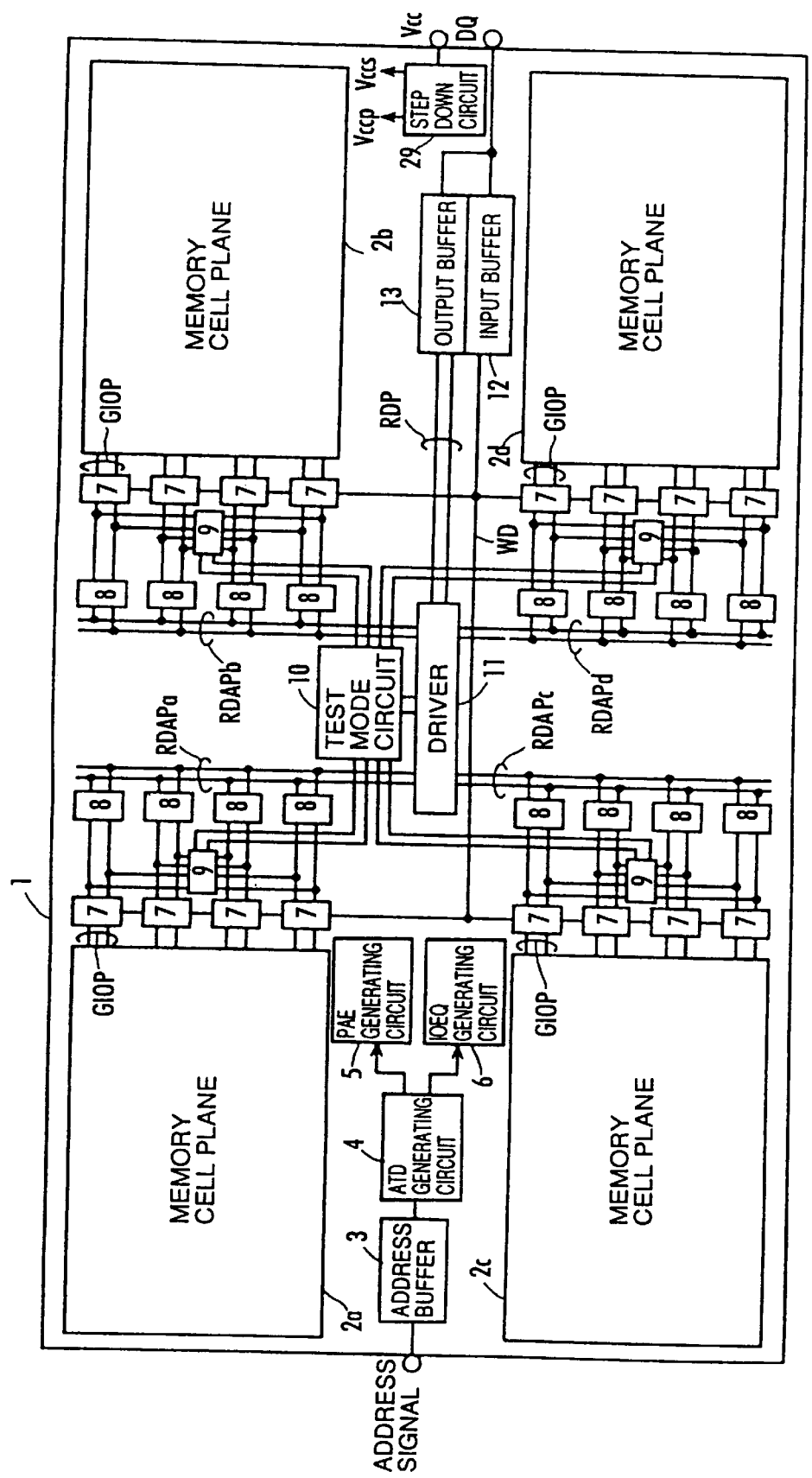
FIG. 17 is a schematic block diagram showing a structure of a conventional semiconductor memory device 1.

FIG. 16 is a circuit diagram showing a structure of the internal control circuit for generating signal MBT0 and MBT1.

Semiconductor memory device 1000 in the embodiment 1 may further include an internal control circuit 260 shown in FIG. 16 in addition to internal control circuit 200.

Internal control circuit 260 includes an AND circuit 262 which receives signal $\phi_{MS}$ issued from the internal control circuit shown in FIG. 11 and address signal bit A2, an AND circuit 264 which receives signal $\phi_{MS}$ and address signal bit A3, an SR flip-flop circuit 268 which receives the output of AND circuit 262 as a set signal, and also receives signal $\phi_{MS}$ as a reset signal, and an AND circuit 270 which receives an output of AND circuit 264 as a set signal, and also receives signal $\phi_{MR}$ as a reset signal.

The structure of internal control circuit 260 is similar to that of the internal control circuit shown in FIG. 12 except for that it uses address signal bits A2 and A3 instead of address signal bits A0 and A1.

By employing appropriate combinations of address signal bits A2 and A3, one or both of signals MBT0 and MBT1 can be set to the active state ("H" level) during the multibit test mode, and both signals MBT0 and MBT1 can be set to "L" level in the reset cycle.

Operations other than the above are similar to those of internal control circuit 200 already discussed with reference to FIG. 12, and will not be described below.

Owing to the above structures, the operations are selected, depending on combinations of signals MBT and MIOT, between detection of match/mismatch of logics of data read from each memory cell plane and detection of match/mismatch of logics of data read from all memory cell planes.

By appropriately employing combinations of signals MBT0 and MBT1, it is possible to vary the number of bits of data which are simultaneously read in each memory cell plane for the multibit test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a multibit test circuit for producing a test result indicating whether data transmitted by a plurality of data bus line pairs are in agreement in a test mode; and
    a plurality of discharge circuits coupled to said plurality of data bus line pairs, each for discharging either one of the lines of the data bus line pair in response to data read from a memory cell array, one of the discharge circuits coupled to an identical one of said plurality of data bus line pairs discharging either one of the lines of the data bus line pair in response to data read from the memory cell array in a normal mode, and at least two of the discharge circuits coupled to each of said plurality of data bus line pairs discharging either one of the lines of each of said plurality of data bus line pairs in response to data read from the memory cell array in the test mode.

2. The semiconductor memory device according to claim 1, wherein each of said plurality of discharge circuits includes a first transistor coupled between one line of a corresponding data bus line pair and ground, and a second transistor coupled between another line of the corresponding data bus line pair and ground.

3. The semiconductor memory device according to claim 1, further comprising:
    a plurality of amplifiers provided corresponding to said plurality of discharge circuits respectively, each of said plurality of amplifiers applying data to a corresponding one of said plurality of discharge circuits from the memory cell array when enabled.

4. The semiconductor memory device according to claim 3, wherein
   one of the amplifiers is enabled and the other amplifiers are disabled in the normal mode, said one and other amplifiers are associated with one of said plurality of data bus line pairs, and
   at least two of the amplifiers associated with each of said plurality of data bus line pairs are enabled in the test mode.

5. The semiconductor memory device according to claim 3, wherein
   each of said plurality of amplifiers has first and second outputs complementary each other, and
   each of said plurality of discharge circuits includes a first transistor coupled between one line of a corresponding data bus line pair and ground, and a second transistor coupled between another line of the corresponding data bus line pair and ground, the first and second transistors being responsive to the first and second outputs respectively.

6. The semiconductor memory device according to claim 1, further comprising:
   a plurality of precharge circuits provided corresponding to said plurality of data bus line pairs respectively, each for precharging a corresponding one of said plurality of data bus line pairs, each of said plurality of precharge circuits being provided in common to the discharge circuits coupled to the corresponding one of said plurality of data bus line pairs.

7. The semiconductor memory device according to claim 6, wherein each of said plurality of precharge circuits includes a first transistor coupled between a power supply and one line of a corresponding data bus line pair, and a second transistor coupled between the power supply and another line of the corresponding data bus line pair.

* * * * *